(12) United States Patent
Kim

(10) Patent No.: US 11,848,263 B2
(45) Date of Patent: Dec. 19, 2023

(54) MULTILAYERED PRINTED CIRCUIT BOARD, METHOD FOR MANUFACTURING THE SAME, AND SEMICONDUCTOR DEVICE USING THE SAME

(71) Applicant: LG CHEM, LTD., Seoul (KR)

(72) Inventor: Seung Lak Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 411 days.

(21) Appl. No.: 16/968,384

(22) PCT Filed: Sep. 20, 2019

(86) PCT No.: PCT/KR2019/012204
§ 371 (c)(1),
(2) Date: Aug. 7, 2020

(87) PCT Pub. No.: WO2020/060265
PCT Pub. Date: Mar. 26, 2020

(65) Prior Publication Data
US 2020/0395289 A1    Dec. 17, 2020

(30) Foreign Application Priority Data

Sep. 20, 2018  (KR) .................... 10-2018-0113248
Sep. 19, 2019  (KR) .................... 10-2019-0115354

(51) Int. Cl.
| | | |
|---|---|---|
| *H01L 23/49* | (2006.01) | |
| *H01L 23/498* | (2006.01) | |
| *H01L 21/48* | (2006.01) | |
| *H01L 21/683* | (2006.01) | |
| *B32B 27/38* | (2006.01) | |
| *B32B 15/04* | (2006.01) | |
| *B32B 15/20* | (2006.01) | |
| *C09D 7/61* | (2018.01) | |

(Continued)

(52) U.S. Cl.
CPC ........ *H01L 23/49894* (2013.01); *B32B 15/04* (2013.01); *B32B 15/20* (2013.01); *B32B 27/38* (2013.01); *C09D 7/61* (2018.01); *C09D 7/67* (2018.01); *C09D 7/68* (2018.01); *C09D 7/69* (2018.01); *C09D 163/00* (2013.01); *H01L 21/481* (2013.01); *H01L 21/4857* (2013.01); *H01L 21/6835* (2013.01); *H01L 2221/68345* (2013.01)

(58) Field of Classification Search
CPC .................................................. H01L 23/49894
USPC ........................................................ 174/258
See application file for complete search history.

(56) References Cited

U.S. PATENT DOCUMENTS

| | | |
|---|---|---|
| 5,544,773 A | 8/1996 | Haruta et al. |
| 5,879,568 A | 3/1999 | Urasaki et al. |
| 8,021,748 B2 | 9/2011 | Asai et al. |

(Continued)

FOREIGN PATENT DOCUMENTS

| | | |
|---|---|---|
| CN | 107926124 A | 4/2018 |
| JP | 2002-249753 A | 9/2002 |

(Continued)

*Primary Examiner* — Stanley Tso
(74) *Attorney, Agent, or Firm* — BRYAN CAVE LEIGHTON PAISNER LLP

(57) ABSTRACT

The present invention relates to a multilayered printed circuit board having excellent durability while having a thin thickness, a method for manufacturing the same, and a semiconductor device using the same.

23 Claims, 1 Drawing Sheet

(51) Int. Cl.
*C09D 163/00* (2006.01)
*C09D 7/40* (2018.01)

(56) References Cited

U.S. PATENT DOCUMENTS

| | | | |
|---|---|---|---|
| 9,247,644 B2 | 1/2016 | Kaneko et al. | |
| 2003/0171477 A1* | 9/2003 | Baba | C08G 77/12 524/492 |
| 2006/0154095 A1* | 7/2006 | Matsumoto | C08J 5/18 428/480 |
| 2007/0013049 A1 | 1/2007 | Asai et al. | |
| 2007/0221400 A1 | 9/2007 | Kurashina et al. | |
| 2008/0014336 A1 | 1/2008 | Asai et al. | |
| 2008/0023815 A1 | 1/2008 | Asai et al. | |
| 2009/0236125 A1 | 9/2009 | Kim et al. | |
| 2009/0236135 A1 | 9/2009 | Ueda et al. | |
| 2010/0240821 A1* | 9/2010 | Nakamura | C08G 18/603 524/538 |
| 2011/0291300 A1* | 12/2011 | Hirano | H01L 21/6836 428/354 |
| 2012/0101191 A1* | 4/2012 | Enomoto | H01L 23/295 523/466 |
| 2014/0116764 A1* | 5/2014 | Inoue | H05K 1/036 428/339 |
| 2015/0223341 A1 | 8/2015 | Kim et al. | |
| 2015/0257277 A1 | 9/2015 | Shirahase et al. | |
| 2015/0282301 A1 | 10/2015 | Nishida et al. | |
| 2016/0021736 A1 | 1/2016 | Han et al. | |
| 2016/0037647 A1* | 2/2016 | Shimizu | H05K 3/4697 361/764 |
| 2017/0029557 A1* | 2/2017 | Inoue | C08G 59/50 |
| 2017/0253013 A1* | 9/2017 | Li | C08L 79/04 |
| 2017/0253693 A1* | 9/2017 | Shoji | C08K 5/18 |
| 2017/0256482 A1 | 9/2017 | Furuichi et al. | |
| 2017/0290149 A1 | 10/2017 | Nakamura et al. | |
| 2017/0352628 A1 | 12/2017 | Furuichi et al. | |
| 2018/0199435 A1 | 7/2018 | Ohnishi et al. | |
| 2020/0247954 A1* | 8/2020 | Koga | C08L 79/08 |

FOREIGN PATENT DOCUMENTS

| | | |
|---|---|---|
| JP | 2004111544 A | 4/2004 |
| JP | 2005-133055 A | 5/2005 |
| JP | 2008-270697 A | 11/2008 |
| JP | 2010-229356 A | 10/2010 |
| JP | 2011-219504 A | 11/2011 |
| JP | 2015003982 A | 1/2015 |
| JP | 2015-080882 A | 4/2015 |
| JP | 2015-149477 A | 8/2015 |
| JP | 2015-163694 A | 9/2015 |
| JP | 2016-34996 A | 3/2016 |
| JP | 2016-082089 A | 5/2016 |
| JP | 2016-096281 A | 5/2016 |
| JP | 2017011298 A | 1/2017 |
| JP | 2017157666 A | 9/2017 |
| JP | 2017-193614 A | 10/2017 |
| JP | 2017220543 A | 12/2017 |
| KR | 10-0688103 B1 | 3/2007 |
| KR | 10-0743231 B1 | 7/2007 |
| KR | 10-0769637 B1 | 10/2007 |
| KR | 10-0957787 B1 | 5/2010 |
| KR | 10-20140139798 A | 12/2014 |
| KR | 10-1479349 B1 | 1/2015 |
| KR | 10-20150093032 * | 8/2015 |
| KR | 10-20150093032 A | 8/2015 |
| KR | 10-2016-0036996 A | 4/2016 |
| KR | 10-20160137410 A | 11/2016 |
| TW | 200524492 A | 7/2005 |
| WO | 2010/082658 A1 | 7/2010 |
| WO | 2018047861 A1 | 3/2018 |

* cited by examiner

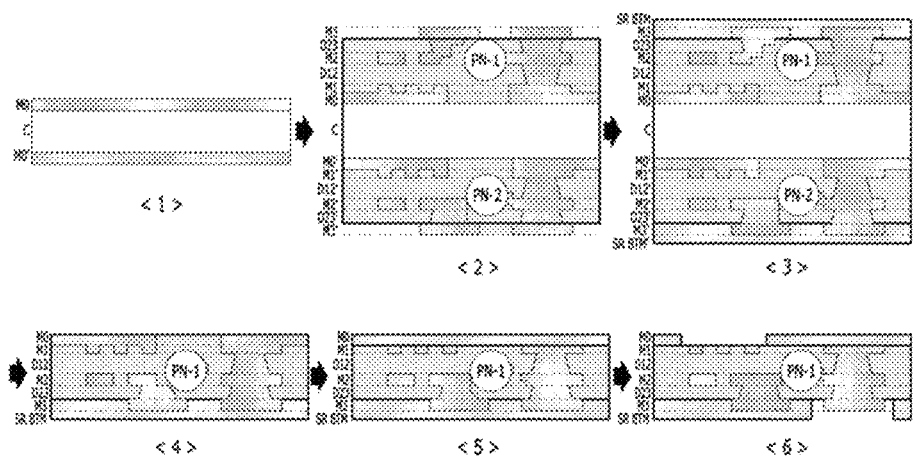

MULTILAYERED PRINTED CIRCUIT BOARD, METHOD FOR MANUFACTURING THE SAME, AND SEMICONDUCTOR DEVICE USING THE SAME

The present application is a National Phase entry pursuant to 35 U.S.C. § 371 of International Application No. PCT/KR2019/012204 filed on Sep. 20, 2019, and claims priority to and the benefit of Korean Patent Application No. 10-2018-0113248 filed with the Korean Intellectual Property Office on Sep. 20, 2018 and Korean Patent Application No. 10-2019-0115354 filed with the Korean Intellectual Property Office on Sep. 19, 2019, the disclosures of which are incorporated herein by reference in their entirety.

FIELD

The present invention relates to a multilayered printed circuit board having excellent durability while having a thin thickness, a method for manufacturing the same, and a semiconductor device using the same.

BACKGROUND

Recently electronic devices are becoming smaller, lighter, and more functional. To this end, as the application field of built-up PCBs (built-up printed circuit hoards) is rapidly expanding, mainly for small devices, the use of multilayered printed circuit boards is rapidly increasing.

Multilayered printed circuit boards are capable of three-dimensional wiring from planar wiring. In particular, in the industrial electronics field, the integration degree of functional elements such as ICs (integrated circuits) and LSI (large scale integration) is improved. It is a product that is advantageous for downsizing, weight reduction, high functionality, structural electrical function integration, shortening of assembly time, and cost reduction of electronic devices.

Recently, a technology for realizing reduced thickness through a coreless multilayer printed circuit board using a removable core film, such as a carrier film, has been actively studied. In particular, as insulating materials used inside such a coreless multilayered printed circuit boards, prepregs are mainly widely used.

However, when applying a prepreg as an insulating material, there is a limit in that it is difficult to sufficiently reduce the thickness of the multilayered printed circuit board due to the fiber reinforcement inside the prepreg. In addition, when only the polymer resin film excluding the fiber reinforcement is applied simply to reduce the thickness of the insulating material, there is a limit in that the brittleness increases and the multilayered printed circuit board is prone to damage during the detachment process of the carrier film.

Accordingly, there is a demand for development of a multilayered printed circuit board having excellent durability while having a thinner thickness than the prepreg.

SUMMARY

It is an object of the present invention to provide a multilayered printed circuit board having excellent durability while having a reduced thickness.

It is another object of the present invention to provide a method for manufacturing the above-mentioned multilayered printed circuit board.

It is a further object of the present invention to provide a semiconductor device including the above-mentioned multilayered printed circuit board.

In order to achieve the above objects, one embodiment of the present invention provides a multilayered printed circuit board including: a resin laminate including a plurality of buildup layers, the buildup layers including an insulation pattern and a metal pattern; and a resist pattern layer formed on upper and lower surfaces of the resin laminate, wherein a thickness of the insulation pattern included in the buildup layer is 15 μm or less.

Another embodiment of the present invention provides a method for manufacturing a multilayered printed circuit board, including: laminating a first metal layer on a surface of a carrier film, and laminating a second metal layer on an opposing surface of the carrier film, to form a pattern; laminating an insulating layer on at least one of the first and second metal layers to form a pattern; laminating a metal layer on the insulating layer to form a pattern; forming a resist layer on the metal layer; and peeling the carrier film from first and second metal layers and laminating a resist layer on the surface of the peeled first and second metal layers to form a pattern, wherein the insulating layer includes a resin-coated metal thin film having a thickness of 15 μm or less, and wherein, after laminating the metal layer on the insulating layer to form a pattern, repeating one or more times the laminating the insulating layer on the at least one of the first and second metal layers to form a pattern and the laminating the metal layer on the insulating layer to form a pattern.

A further embodiment of the present invention provides a semiconductor device including the above-mentioned multilayered printed circuit board.

BRIEF DESCRIPTION OF THE DRAWING

FIG. 1 is a schematic illustration of a manufacturing process of a multilayer printed circuit board of Example 1.

EXPLANATION OF SYMBOLS

C: carrier Film
M0, M0': ultra-thin copper foil
SR TOP, SR TOP': resist
M1, M1': copper foil layer
D12, D12': insulating layer
M2, M2': copper foil layer
D23, D23': insulating layer
M3, M3': copper foil layer
D34, D34': insulating layer
M4, M4': copper foil layer
SR BTM, SR BTM': resist
PN-1: first panel
PN-2: second panel
<1> to <6>: progress sequence of steps

DETAILED DESCRIPTION

Hereinafter, a multilayered printed circuit board according to a specific embodiment of the present invention, a manufacturing method thereof, and a semiconductor device using the same will be described in more detail.

I. Multilayered Printed Circuit Board

According to one embodiment of the present invention, a multilayered printed circuit board can be provided, including: a resin laminate including a plurality of buildup layers including an insulation pattern and a metal pattern; and a resist pattern layer formed on upper and lower surfaces of the resin laminate, wherein a thickness of an insulation pattern included in the buildup layer is 15 µm or less.

The present inventors found through experiments that, similarly to the multilayered printed circuit board of the above-mentioned embodiment, as the thickness of the insulation pattern contained in each buildup layer included in the resin laminate is reduced to 15 µm or less, the thickness of the multilayered printed circuit board, on which a total of five buildup layers are laminated can be made ultra-thin at 75 µm or less, and the thickness of the multilayered printed circuit board on which a total of seven buildup layers are laminated can be made ultra-thin at 105 µm or less, thereby completing the present invention.

In particular, in the multilayer printed circuit board of one embodiment of the invention, as a resist layer is formed on the upper and lower surfaces of the resin laminate, it is possible to prevent breakage of a product such as tearing, and thus achieve excellent durability even during the manufacture of ultra-thin multilayer printed circuit boards.

Conventionally, a multilayered printed circuit board has been manufactured mainly using a prepreg in which a resin composition is impregnated into a woven glass fiber as an insulating layer. However, as the thickness of the insulation pattern contained in each buildup layer included in the resin laminate increases to 16 µm or more, it is limited in that the thickness of the multilayered printed circuit board on which a total of five buildup layers are laminated is increased to 80 µm or more, and the thickness of the multilayered printed circuit board on which a total of seven buildup layers are laminated is increased to 112 µm or more.

(1) Resin Laminate

The multilayered printed circuit board may include a resin laminate including a plurality of buildup layers including an insulation pattern and a metal pattern. The resin laminate may have a shape in which 2 or more, or 2 to 20, buildup layers are laminated, and may be referred to as a panel. The buildup layer may include an insulation pattern and a metal pattern.

Specifically, each of the buildup layers may include an insulation pattern and a metal pattern, wherein metal patterns included in the buildup layers adjacent to each other may be in contact with each other to transmit an electrical signal.

The metal pattern means a metal block obtained through partial etching of the metal layer in the method for manufacturing the multilayered printed circuit board described hereinafter. Examples of the metal included in the metal pattern include a metal such as gold, silver, copper, tin, nickel, aluminum, titanium, or an alloy containing a mixture of two or more thereof, and the like. The metal pattern may have a thickness of 1 µm to 20 µm, 5 µm to 15 µm, or 9 µm to 11 µm. When the thickness of the metal pattern is excessively increased, excess metal is required to form a metal pattern, and therefore the raw material cost is increased which may cause economic efficiency to decline, and it may be difficult to apply to thinned and highly integrated semiconductor devices.

The insulation pattern means a polymer resin block obtained through partial etching of an insulating layer in a method of manufacturing a multilayered printed circuit board described hereinafter. More specifically, when a resin-coated metal thin film is used as an insulating layer in the manufacturing method of the multilayer printed circuit board, the insulation pattern means a resin coating layer included in the resin-coated metal thin film.

The insulation pattern may have a thickness of 15 µm or less, 10 µm or less, 1 µm to 15 µm, 1 µm to 10 µm, 5 µm to 10 µm, or 6 µm to 8 µm. When the thickness of the insulating pattern is excessively increased, the excess insulation material is required to form an insulation pattern, and therefore the raw material cost may increase which can cause economic efficiency to decline, and it may be difficult to apply to thinned and highly integrated semiconductor devices.

Specific compositions of the insulation pattern are not particularly limited, but the insulation pattern may include a cured product between: an amine compound containing one or more functional groups selected from the group consisting of i) a sulfone group, a carbonyl group, a halogen group, an alkyl group having 1 to 20 carbon atoms which is unsubstituted or substituted by a nitro group, a cyano group, or a halogen group, ii) an aryl group having 6 to 20 carbon atoms which is unsubstituted or substituted by a nitro group, a cyano group, or a halogen group, iii) a heteroaryl group having 2 to 30 carbon atoms which is unsubstituted or substituted by a nitro group, a cyano group, or a halogen group, and iv) an alkylene group having 1 to 20 carbon atoms which is unsubstituted or substituted by a nitro group, a cyano group, or a halogen group; a thermosetting resin; and a thermoplastic resin, and an inorganic filler dispersed within the cured products.

More specifically, the insulation pattern may include a cured product of the thermosetting resin composition for coating a metal thin film, including: an amine compound containing one or more functional groups selected from the group consisting of i) a sulfone group, a carbonyl group, a halogen group, an alkyl group having 1 to 20 carbon atoms which is unsubstituted or substituted by a nitro group, a cyano group, or a halogen group, ii) an aryl group having 6 to 20 carbon atoms which is unsubstituted or substituted by a nitro group, a cyano group, or a halogen group, iii) a heteroaryl group having 2 to 30 carbon atoms which is unsubstituted or substituted by a nitro group, a cyano group, or a halogen group, and iv) an alkylene group having 1 to 20 carbon atoms which is unsubstituted or substituted by a nitro group, a cyano group, or a halogen group; a thermosetting resin; a thermoplastic resin, and an inorganic filler, wherein the thermoplastic resin is included in an amount of 40 parts by weight to 90 parts by weight based on 100 parts by weight of the total of the amine compound and the thermosetting resin, and wherein the thermosetting resin composition has complex viscosity of 2000 Pa·s or less in the range of 120° C. to 180° C.

The insulation pattern has a feature that the type of resin and the mixing ratio thereof is optimized by introducing a resin system composed of an epoxy and an amine curing agent and the like, and a certain amount of thermoplastic resin, thereby securing the flow property of the resin.

More specifically, the curing reaction of the resin can be easily controlled by using a specific amine curing agent. More specifically, the modulus can be lowered by adjusting the functional group of the amine curing agent to adjust the number of bonds generated during the curing reaction of the resin. As a result, the crack resistance is increased, and it becomes possible to have more stability against the same tensile force or impact.

The cured product between: an amine compound containing one or more functional groups selected from the group consisting of i) a sulfone group, a carbonyl group, a halogen group, an alkyl group having 1 to 20 carbon atoms which is unsubstituted or substituted by a nitro group, a cyano group, or a halogen group, ii) an aryl group having 6 to 20 carbon atoms which is unsubstituted or substituted by a nitro group, a cyano group, or a halogen group, iii) a heteroaryl group having 2 to 30 carbon atoms which is unsubstituted or substituted by a nitro group, a cyano group, or a halogen group, and iv) an alkylene group having 1 to 20 carbon atoms which is unsubstituted or substituted by a nitro group, a cyano group, or a halogen group; a thermosetting resin; and a thermoplastic resin, or the coating cured product of the thermosetting resin composition for coating a metal thin film, has a glass transition temperature (Tg) of 220° C. to 240° C.

In addition, the cured product between: an amine compound containing one or more functional groups selected from the group consisting of i) a sulfone group, a carbonyl group, a halogen group, an alkyl group having 1 to 20 carbon atoms which is unsubstituted or substituted by a nitro group, a cyano group, or a halogen group, ii) an aryl group having 6 to 20 carbon atoms which is unsubstituted or substituted by a nitro group, a cyano group, or a halogen group, iii) a heteroaryl group having 2 to 30 carbon atoms which is unsubstituted or substituted by a nitro group, a cyano group, or a halogen group, and iv) an alkylene group having 1 to 20 carbon atoms which is unsubstituted or substituted by a nitro group, a cyano group, or a halogen group; a thermosetting resin; and a thermoplastic resin, or the coating cured product of the thermosetting resin composition for coating a metal thin film, has tensile elongation in the MD direction of 1% or more, 1% to 10%, 2% to 5%, 3% to 4%, or 3.6% to 3.8%, which is measured using a Universal Testing Machine (Instron 3365) according to IPC-TM-650 (2.4.18.3).

That is, as a result of performing a tensile test together with a resin composition consisting of monomolecular types, it can be observed that when compared at the same thickness, the elongation at breakage is much better, thereby confirming that the crack resistance is excellent.

Therefore, the present invention can contribute to improving the performance of the semiconductor device because the crack resistance is, when compared at the same thickness, superior as compared with a conventional resin-coated copper foil consisting of monomolecular types.

In addition, the rheometer lowest viscosity window is widened, which is advantageous for the flow property and the pattern filling property. Preferably, within the temperature window of the metal foil lamination process, the window maintaining the lowest viscosity is widened, thereby realizing the effect of improving the flow property of the resin.

For example, assuming that the complex viscosity suitable for filling the pattern is 2000 Pa·s or less, in the case of the thermosetting resin composition for coating a metal thin film, the temperature window satisfying the viscosity condition is as wide as 120° C. to 180° C. That is, the flow property in the lamination process section is high and the pattern filling property is excellent, thereby improving the crack resistance of the metal thin film coated with the thermosetting resin composition.

The thermosetting resin composition for coating a metal thin film may include an amine compound, a thermosetting resin, a thermoplastic resin, and an inorganic filler.

The content of the aforementioned components is not particularly limited, but in consideration of the physical properties of the final product manufactured from the thermosetting resin composition for coating a metal thin film, the aforementioned components can be included, and the content ratio between these components is as described below.

Specifically, the thermosetting resin composition may include an amine compound containing one or more functional groups selected from the group consisting of i) a sulfone group, a carbonyl group, a halogen group, an alkyl group having 1 to 20 carbon atoms which is unsubstituted or substituted by a nitro group, a cyano group, or a halogen group, ii) an aryl group having 6 to 20 carbon atoms which is unsubstituted or substituted by a nitro group, a cyano group, or a halogen group, iii) a heteroaryl group having 2 to 30 carbon atoms which is unsubstituted or substituted by a nitro group, a cyano group, or a halogen group, and iv) an alkylene group having 1 to 20 carbon atoms which is unsubstituted or substituted by a nitro group, a cyano group, or a halogen group. The amine compound can be used as an amine curing agent.

In this case, the alkyl group having 1 to 20 carbon atoms, the aryl groups having 6 to 20 carbon atoms, the heteroaryl group having 2 to 30 carbon atoms, and the alkylene group having 1 to 20 carbon atoms contained in the amine compound may each independently be substituted with one or more functional groups selected from the group consisting of a nitro group, a cyano group, and a halogen group.

The one or more functional groups selected from the group consisting of i) a sulfone group, a carbonyl group, a halogen group, an alkyl group having 1 to 20 carbon atoms which is unsubstituted or substituted by a nitro group, a cyano group, or a halogen group, ii) an aryl group having 6 to 20 carbon atoms which is unsubstituted or substituted by a nitro group, a cyano group, or a halogen group, iii) a heteroaryl group having 2 to 30 carbon atoms which is unsubstituted or substituted by a nitro group, a cyano group, or a halogen group, and iv) an alkylene group having 1 to 20 carbon atoms which is unsubstituted or substituted by a nitro group, a cyano group, or a halogen group contained in the amine compound are each a strong electron withdrawing group (EWG), and the amine compound containing the electron withdrawing group has reduced reactivity as compared with an amine compound not containing the electron withdrawing group, thereby easily controlling the curing reaction of the resin composition.

Therefore, the degree of curing reaction of the composition can be adjusted by the amine compound to improve the flow property, thereby improving the filling property of the circuit pattern.

The amine compound includes one or more functional groups selected from the group consisting of i) a sulfone group, a carbonyl group, a halogen group, an alkyl group having 1 to 20 carbon atoms which is unsubstituted or substituted by a nitro group, a cyano group, or a halogen group, ii) an aryl group having 6 to 20 carbon atoms which is unsubstituted or substituted by a nitro group, a cyano group, or a halogen group, iii) a heteroaryl group having 2 to 30 carbon atoms which is unsubstituted or substituted by a nitro group, a cyano group, or a halogen group, and iv) an alkylene group having 1 to 20 carbon atoms which is unsubstituted or substituted by a nitro group, a cyano group, or a halogen group, and the amine compound may be an aromatic amine compound containing 2 to 5 amine groups.

More specifically, the amine compound may include one or more compounds selected from the group consisting of the following Chemical Formulas 1 to 3.

[Chemical Formula 1]

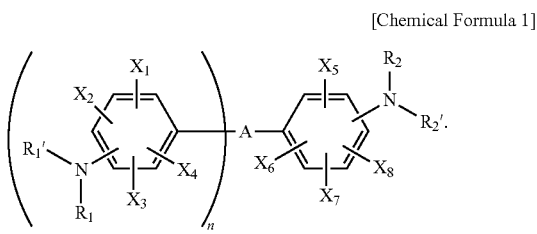

In Chemical Formula 1, A is a sulfone group, a carbonyl group, or an alkylene group having 1 to 10 carbon atoms, $X_1$ to $X_8$ are each independently a nitro group, a cyano group, a hydrogen atom, a halogen group, an alkyl group having 1 to 6 carbon atoms, an aryl group having 6 to 15 carbon atoms, or a heteroaryl group having 2 to 20 carbon atoms, $R_1$, $R_1'$, $R_2$, and $R_2'$ are each independently a hydrogen atom, a halogen group, an alkyl group having 1 to 6 carbon atoms, an aryl group having 6 to 15 carbon atoms, or a heteroaryl group having 2 to 20 carbon atoms, and n is an integer of 1 to 10.

The alkylene group having 1 to 10 carbon atoms, the alkyl group having 1 to 6 carbon atoms, the aryl group having 6 to 15 carbon atoms, and the heteroaryl group having 2 to 20 carbon atoms may each independently be substituted with one or more functional groups selected from the group consisting of a nitro group, a cyano group, and a halogen group.

[Chemical Formula 2]

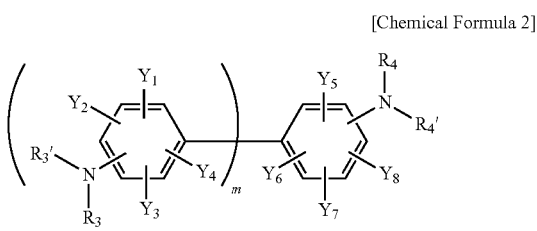

In Chemical Formula 2, $Y_1$ to $Y_8$ are each independently a nitro group, a cyano group, a hydrogen atom, a halogen group, an alkyl group having 1 to 6 carbon atoms, an aryl group having 6 to 15 carbon atoms, or a heteroaryl group having 2 to 20 carbon atoms, $R_3$, $R_3'$, $R_4$ and $R_4'$ are each independently a hydrogen atom, a halogen group, an alkyl group having 1 to 6 carbon atoms, an aryl group having 6 to 15 carbon atoms, or a heteroaryl group having 2 to 20 carbon atoms, m is an integer of 1 to 10, and the alkyl group having 1 to 6 carbon atoms, the aryl group having 6 to 15 carbon atoms, and the heteroaryl group having 2 to 20 carbon atoms may each independently be substituted with one or more functional groups selected from the group consisting of a nitro group, a cyano group, and a halogen group.

[Chemical Formula 3]

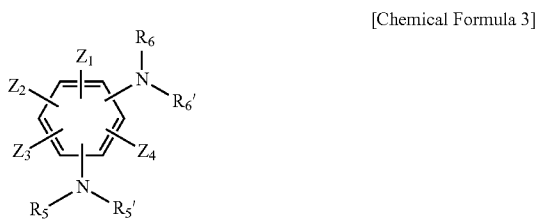

In Chemical Formula 3, $Z_1$ to $Z_4$ are each independently a nitro group, a cyano group, a hydrogen atom, a halogen group, an alkyl group having 1 to 6 carbon atoms, an aryl group having 6 to 15 carbon atoms, or a heteroaryl group having 2 to 20 carbon atoms, $R_5$, $R_5'$, $R_6$, and $R_6'$ are each independently a hydrogen atom, a halogen group, an alkyl group having 1 to 6 carbon atoms, an aryl group having 6 to 15 carbon atoms, or a heteroaryl group having 2 to 20 carbon atoms, and the alkyl group having 1 to 6 carbon atoms, the aryl group having 6 to 15 carbon atoms, and the heteroaryl group having 2 to 20 carbon atoms may each independently be substituted with one or more functional groups selected from the group consisting of a nitro group, a cyano group, and a halogen group.

The alkyl group is a monovalent functional group derived from alkane, and examples thereof include a linear, branched, or cyclic group, such as methyl, ethyl, propyl, isobutyl, sec-butyl, tert-butyl, pentyl, hexyl, and the like. The one or more hydrogen atoms contained in the alkyl group may each be substituted with a substituent.

The alkylene group is a divalent functional group derived from alkane, and examples thereof include a linear, branched, or cyclic group, such as a methylene group, an ethylene group, a propylene group, an isobutylene group, a sec-butylene group, a tert-butylene group, a pentylene group, a hexylene group, and the like. The one or more hydrogen atoms contained in the alkylene group can each be substituted with substituents, similarly to the alkyl group.

The aryl group is a monovalent functional group derived from arene, which may be, for example, a monocyclic or polycyclic group. Specific examples of the monocyclic aryl group include, but are not limited to, a phenyl group, a biphenyl group, a terphenyl group, a stilbenyl group, and the like. Examples of the polycyclic aryl group include, but are not limited to, a naphthyl group, an anthryl group, a phenanthryl group, a pyrenyl group, a perylenyl group, a chrysenyl group, and a fluorenyl group. One or more hydrogen atoms of these aryl groups may each be substituted with substituents, similarly to the alkyl group.

The heteroaryl group is a heterocyclic group containing O, N, or S as a heteroatom, and the carbon number thereof is not particularly limited, but may be from 2 to 30. Examples of the heterocyclic group include, but not are limited to, a thiophene group, a furan group, a pyrrole group, an imidazole group, a thiazole group, an oxazole group, an oxadiazole group, a triazole group, a pyridyl group, a bipyridyl group, a triazine group, an acridyl group, a pyridazine group, a quinolinyl group, an isoquinoline group, an indole group, a carbazole group, a benzoxazole group, a benzimidazole group, a benzothiazole group, a benzocarbazole group, a benzothiophene group, a dibenzothiophene group, a benzofuranyl group, a dibenzofuranyl group, and the like. One or more hydrogen atoms of these heteroaryl groups may each be substituted with substituents, similarly to the alkyl group.

The term "substituted" means that a hydrogen atom bonded to a carbon atom of a compound is changed into another functional group, and a position to be substituted is not limited as long as the position is one at which the hydrogen atom is substituted, that is, a position at which the substituent can be substituted, and when two or more are substituted, the two or more substituents may be the same as or different from each other.

More specifically, Chemical Formula 1 may include a compound represented by the following Chemical Formula 1-1.

[Chemical Formula 1-1]

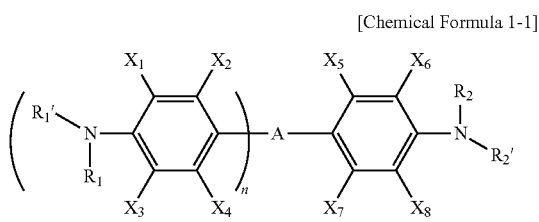

In Chemical Formula 1-1, A, $X_1$ to $X_8$, $R_1$, $R_1'$, $R_2$, $R_2'$, and n have the same meaning as defined in Chemical Formula 1.

Specific examples of Formula 1-1 include 4,4'-diaminodiphenyl sulfone (in Formula 1-1, A is a sulfone group, $X_1$ to $X_8$, $R_1$, $R_1'$, $R_2$, and $R_2'$ are each independently a hydrogen atom, and n is 1), bis(4-aminophenyl)methanone (in Formula 1-1, A is a carbonyl group, $X_1$ to $X_8$, $R_1$, $R_1'$, $R_2$ and $R_2'$ are each independently a hydrogen atom, and n is 1), 4,4'-(perfluoropropane-2,2-diyl)dianiline (in Formula 1-1, A is perfluoropropane-2,2-diyl, $X_1$ to $X_8$, $R_1$, $R_1'$, $R_2$, and $R_2'$ are each independently a hydrogen atom, and n is 1), 4,4'-(2,2,2-trifluoroethane-1,1-diyl)dianiline (in Formula 1-1, A is 2,2,2-trifluoroethane-1,1-diyl, $X_1$ to $X_8$, $R_1$, $R_1'$, $R_2$, and $R_2'$ are each independently a hydrogen atom, and n is 1), and the like.

In addition, Chemical Formula 2 may include a compound represented by the following Chemical Formula 2-1.

[Chemical Formula 2-1]

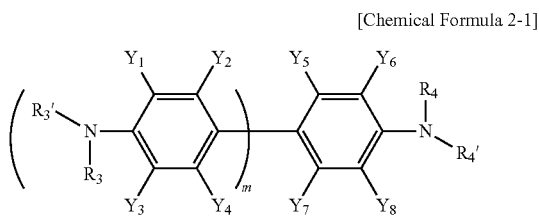

In Chemical Formula 2-1, $Y_1$ to $Y_8$, $R_3$, $R_3'$, $R_4$, $R_4'$, and m have the same meaning as defined in Chemical Formula 2.

Specific examples of Formula 2-1 include 2,2',3,3',5,5',6,6'-octafluorobiphenyl-4,4'-diamine (in Formula 2-1, $Y_1$ to $Y_8$ are a halogen group such as fluorine, $R_3$, $R_3'$, $R_4$, and $R_4'$ are each independently a hydrogen atom, and m is 1), 2,2'-bis(trifluoromethyl)biphenyl-4,4'-diamine (wherein $Y_2$ and $Y_7$ are each independently a trifluoromethyl group, $Y_1$, $Y_3$, $Y_4$, $Y_5$, $Y_6$, and $Y_8$ are a hydrogen atom, $R_3$, $R_3'$, $R_4$, and $R_4'$ are each independently a hydrogen atom, and m is 1), and the like.

Further, Chemical Formula 3 may include a compound represented by the following Chemical Formula 3-1.

[Chemical Formula 3-1]

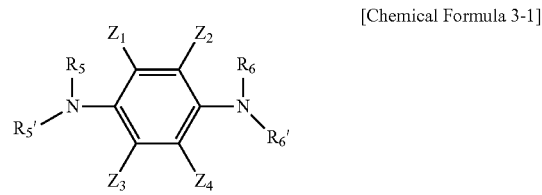

In Chemical Formula 3-1, $Z_1$ to $Z_4$, $R_5$, $R_5'$, $R_6$, and $R_6'$ have the same meaning as defined in Chemical Formula 3.

Specific examples of Formula 3-1 include 2,3,5,6-tetrafluorobenzene-1,4-diamine (in Formula 3-1, $Z_1$ to $Z_4$ are a halogen group such as fluorine, and $R_5$, $R_5'$, $R_6$, and $R_6'$ are each independently a hydrogen atom) and the like.

The content of the amine compound may be 5% by weight to 50% by weight, or 10% by weight to 20% by weight, with respect to the total weight of the amine compound and the resin component (specifically, the total of the thermosetting resin and the thermoplastic resin). If the content of the amine compound is excessively reduced to less than 5% by weight, it may cause non-curing. If the content of the amine compound is excessively increased to more than 50% by weight, the curing rate may be increased so that the flow property of the thermosetting resin composition may be lowered, and also, the mechanical properties of the metal thin film using the thermosetting resin composition may be lowered by the unreacted amine compound.

Meanwhile, the thermosetting resin composition for coating a metal thin film may include a thermosetting resin.

The thermosetting resin may include a dicyclopentadiene type of epoxy resin and a biphenyl type of epoxy resin. Specifically, the content of the biphenyl type of epoxy resin may be less than 100 parts by weight, 1 part by weight to 90 parts by weight, 5 parts by weight to 80 parts by weight, 10 parts by weight to 70 parts by weight, or 20 parts by weight to 50 parts by weight, based on 100 parts by weight of the dicyclopentadiene type of epoxy resin.

More specifically, the biphenyl type of epoxy resin may be an epoxy resin represented by the following Chemical Formula 11, and the dicyclopentadiene type of epoxy resin may be an epoxy resin represented by the following Chemical Formula 12.

[Chemical Formula 11]

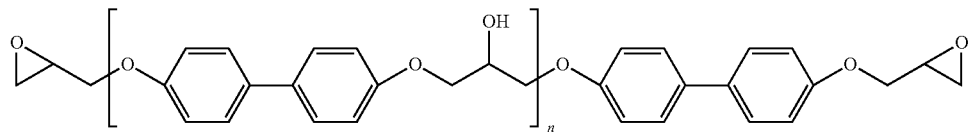

In Chemical Formula 11, n is an integer of 0 or 1 to 50.

[Chemical Formula 12]

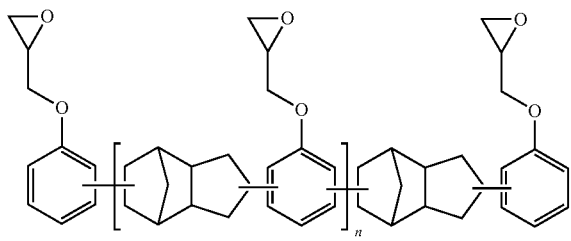

In Chemical Formula 12, n is an integer of 0 or 1 to 50.

Specific examples of the dicyclopentadiene type of epoxy resin may include XD-1000 (available from Nippon Kayaku), and specific examples of the biphenyl type of epoxy resin may include NC-3000H (available from Nippon Kayaku).

Further, the thermosetting resin may include one or more resins selected from the group consisting of a bismaleimide resin, a cyanate ester resin, and a bismaleimide-triazine resin.

As the bismaleimide resin, those commonly used for a thermosetting resin composition for coating a metal thin film can be used without limitation, and the type thereof is not limited. As a preferable example, the bismaleimide resin may be one or more selected from the group consisting of a diphenylmethane type of bismaleimide resin represented by the following Chemical Formula 13, a phenylene type of bismaleimide resin represented by the following Chemical Formula 14, a bisphenol A type of diphenyl ether bismaleimide resin represented by the following Chemical Formula 15, and an oligomer of a diphenylmethane type of bismaleimide resin and a phenylmethane type of bismaleimide resin represented by the following Chemical Formula 16.

[Chemical Formula 13]

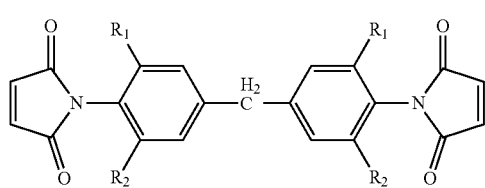

In Chemical Formula 13, $R_1$ and $R_2$ are each independently H, $CH_3$, or $C_2H_5$.

[Chemical Formula 14]

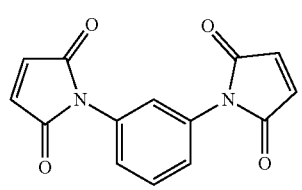

[Chemical Formula 15]

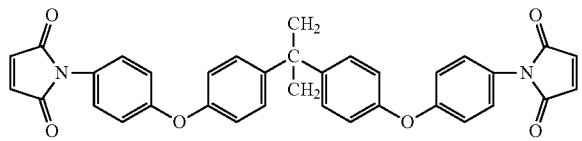

[Chemical Formula 16]

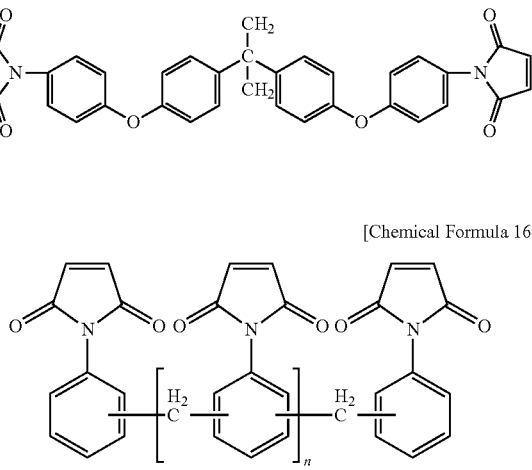

In Chemical Formula 16, n is an integer of 0 or 1 to 50.

In addition, specific examples of the cyanate-based resins include cyanate ester resins, and those commonly used for a thermosetting resin composition for coating a metal thin film can be used without limitation, and the type thereof is not limited.

As a preferable example, the cyanate ester resin may be a novolac type of cyanate resin represented by the following Chemical Formula 17, a dicyclopentadiene type of cyanate resin represented by the following Chemical Formula 18, a bisphenol type of cyanate resin represented by the following Chemical Formula 19, and their partially-triazinated prepolymers. These can be used alone or in a combination of two or more types thereof.

[Chemical Formula 17]

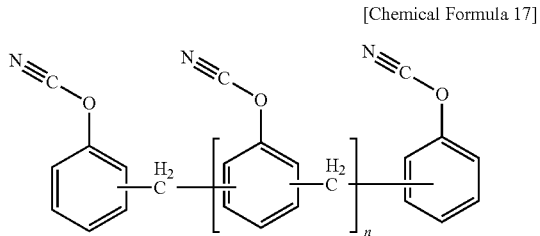

In Chemical Formula 17, n is an integer of 0 or 1 to 50.

[Chemical Formula 18]

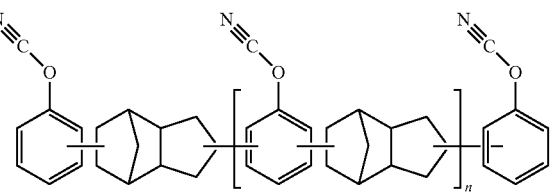

In Chemical Formula 18,
n is an integer of 0 or 1 to 50.

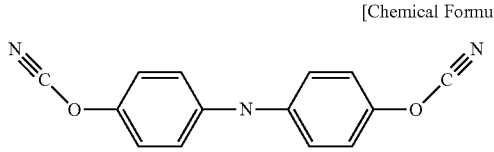
[Chemical Formula 19]

In Chemical Formula 19,
R is

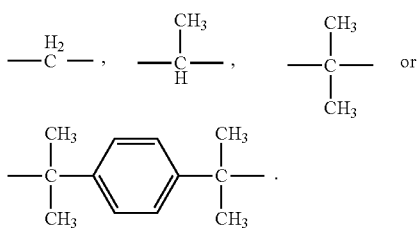

More specifically, the cyanate resin of Chemical Formula 19 may be a bisphenol-A type of cyanate resin, a bisphenol-E type of cyanate resin, a bisphenol-F type of cyanate resin, or a bisphenol-M type of cyanate resin, respectively, depending on the type of R.

The bismaleimide resin may include bismaleimide-triazine resin, etc. As the bismaleimide-triazine resin, those commonly used for a thermosetting resin composition for coating a metal thin film can be used without limitation, and the type thereof is not limited. Preferred examples of the bismaleimide resin include BMI-2300 (available from DAIWA KASEI).

In particular, as the resin composition for coating a metal thin film includes the thermosetting resin in an amount of 400 parts by weight or less based on 100 parts by weight of the amine compound, it is possible to prevent a change in physical properties of the thermosetting resin due to the filler charged at a high content, and induce uniform curing of the thermosetting resin at a sufficient level without being influenced by the filler, thereby improving the reliability of the finally manufactured product, improving the mechanical properties such as toughness, and sufficiently lowering the glass transition temperature.

Conventionally, as in the case where the thermosetting resin is contained in an amount of 400 parts by weight or less, based on 100 parts by weight of the amine curing agent, addition of the amine compound in a relatively excessive amount causes problems that the flow property and moldability are reduced due to excessive curing of the thermosetting resin. However, even when a specific amine curing agent having decreased reactivity by including the electron withdrawing group (EWG) as described above is added in an excessive amount, the rapid increase in the curing rate of the thermosetting resin can be suppressed due to a reduction in the reactivity of the curing agent. Therefore, the resin composition for coating a metal thin film and the metal foil obtained therefrom can exhibit a high flow property even during long-term storage and have an excellent flow property.

Specifically, the resin composition for coating a metal thin film may contain the thermosetting resin in an amount of 400 parts by weight or less, 150 parts by weight to 400 parts by weight, 180 parts by weight to 300 parts by weight, 180 parts by weight to 290 parts by weight, 190 parts by weight to 290 parts by weight, or 240 parts by weight to 260 parts by weight, based on 100 parts by weight of the amine curing agent. When the amine curing agent or the thermosetting resin is a mixture of two or more types thereof, the content of the thermosetting resin mixture may also be 400 parts by weight or less, 150 parts by weight to 400 parts by weight, 180 parts by weight to 300 parts by weight, 180 parts by weight to 290 parts by weight, 190 parts by weight to 290 parts by weight, or 240 parts by weight to 260 parts by weight, based on 100 parts by weight of the amine curing agent mixture.

If the content of the thermosetting resin is excessively increased to more than 400 parts by weight based on 100 parts by weight of the amine curing agent, it is difficult for the thermosetting resin to be uniformly cured to a sufficient level due to the influence of the filler charged at a high content. Thus, the reliability of the finally manufactured product may be deteriorated, and mechanical properties such as toughness may also be deteriorated.

Further, based on the total weight of the amine compound and the resin component (specifically, the total of the thermosetting resin and the thermoplastic resin), the content of the epoxy resin may be 30% by weight to 80% by weight, and the content of the bismaleimide may be 1% by weight to 20% by weight. Preferably, the content of the epoxy resin may be 35% by weight to 70% by weight based on the total weight of the amine compound and the resin component (specifically, the total of the thermosetting resin and the thermoplastic resin). In addition, the content of the bismaleimide may be 1% by weight to 10% by weight based on the total weight of the amine compound and the resin component (specifically, the total of the thermosetting resin and the thermoplastic resin).

If the amount of the epoxy resin used is less than 30% by weight, there is a problem that it is difficult to implement a high Tg, and if the amount of the epoxy resin used is more than 80% by weight, there is a problem that the flow property is deteriorated.

If the amount of the bismaleimide resin used is less than 1% by weight, there is a problem in that the desired physical properties are not realized. If the amount of the bismaleimide resin is more than 20% by weight, there are many unreacted groups, which may adversely affect properties such as chemical resistance.

Meanwhile, the resin composition for coating a metal thin film may have an equivalent ratio calculated by the following Mathematical Equation 1, of 1.4 or more, 1.4 to 2.5, 1.45 to 2.5, 1.45 to 2.1, 1.45 to 1.8, 1.49 to 1.75, or 1.6 to 1.7.

Equivalent ratio=Total active hydrogen equivalent weight contained in the amine compound(curing agent)/Total curable functional group equivalent weight contained in the thermosetting resin    [Mathematical Equation 1]

More specifically, in Mathematical Equation 1, the total active hydrogen equivalent weight contained in the amine curing agent means a value obtained by dividing the total weight (unit: g) of the amine curing agent by the active hydrogen unit equivalent weight (g/eq) of the amine curing agent.

When the amine curing agent is a mixture of two or more types thereof, the values are calculated by dividing the weight (unit: g) for each compound by the active hydrogen unit equivalent weight (g/eq), and by using the value obtained by totaling the divided values, the total active hydrogen unit equivalent weight contained in the amine curing agent according to Mathematical Equation 1 can be determined.

The active hydrogen contained in the amine curing agent means a hydrogen atom contained in the amino group ($NH_2$) present in the amine curing agent, and the active hydrogen can form a curing structure through reaction with the curable functional group of the thermosetting resin Further, in Mathematical Equation 1, the total curable functional group equivalent weight contained in the thermosetting resin means a value obtained by dividing the total weight (unit: g) of the thermosetting resin by the curable functional unit equivalent weight (g/eq) of the thermosetting resin.

When the thermosetting resin is a mixture of two or more types thereof, the values are calculated by dividing the weight (unit: g) for each compound by the curable functional group unit equivalent weight (g/eq), and by using the value obtained by totaling the divided values, the total curable functional group equivalent weight contained in the thermosetting resin according to Mathematical Equation 1 can be determined.

The curable functional group contained in the thermosetting resin means a functional group forming a curing structure through reaction with the active hydrogen of the amine curing agent, and the type of the curable functional group may vary depending on the type of the thermosetting resin.

For example, when an epoxy resin is used as the thermosetting resin, the curable functional group contained in the epoxy resin may be an epoxy group. When a bismaleimide resin is used as the thermosetting resin, the curable functional group contained in the bismaleimide resin can be a maleimide group.

That is, the fact that the resin composition for coating a metal thin film satisfies the equivalent ratio calculated by Mathematical Equation 1 of 1.4 or more means that the amine curing agent is contained at such a level that the curable functional group contained in all thermosetting resins causes a sufficient curing reaction. Therefore, in the resin composition for coating a metal thin film, when the equivalent ratio calculated by Mathematical Equation 1 decreases to less than 1.4, it is difficult for the thermosetting resin to be uniformly cured to a sufficient level due to the influence of the filler charged at a high content. Thus, there is a disadvantage that the reliability of the finally manufactured product may be deteriorated, and mechanical properties such as toughness may also be deteriorated.

Meanwhile, the resin composition for coating a metal thin film may include a thermoplastic resin.

The thermoplastic resin has an effect of increasing toughness after curing and lowers a coefficient of thermal expansion and elastic modulus, thereby serving to relieve warpage of the metal thin film. Specific examples of the thermoplastic resin include a (meth)acrylate-based polymer.

Examples of the (meth)acrylate-based polymer are not particularly limited, and examples thereof may be an acrylic ester copolymer containing a repeating unit derived from a (meth)acrylate-based monomer and a repeating unit derived from (meth)acrylonitrile; or an acrylic ester copolymer containing a repeating unit derived from butadiene. For example, the (meth)acrylate-based polymer may be a copolymer copolymerized using monomers such as butyl acrylate, ethyl acrylate, acrylonitrile, methyl methacrylate, and glycidyl methacrylate in the range of 1% to 40% by weight (relative to the total weight of the entire monomer), respectively.

The (meth)acrylate-based polymer may have a weight average molecular weight of 500,000 to 1,000,000. If the weight average molecular weight of the (meth)acrylate-based polymer is too small, the effects of increasing toughness after curing and of decreasing the coefficient of thermal expansion and elastic modulus are reduced, which may be technically disadvantageous.

As used herein, the weight average molecular weight refers to a weight average molecular weight in terms of polystyrene measured by the GPC method. In the process of measuring the weight average molecular weight in terms of polystyrene measured by the GPC method, a detector and an analytical column, such as a commonly known analysis apparatus and differential refractive index detector, can be used, and commonly applied temperature conditions, solvent, and flow rate can be used. Specific examples of the measurement conditions are as follows: Waters PL-GPC220 instrument equipped with Polymer Laboratories PLgel MIX-B, 300 mm column is used, an evaluation temperature is 160° C., 1,2,4-trichlorobenzene is used as a solvent, the flow rate is 1 mL/min, a sample is prepared at a concentration of 10 mg/10 mL, and then fed in an amount of 2 μL, and the value of Mw can be determined using calibration curves formed from a polystyrene standard. The molecular weight of the polystyrene standards is nine kinds of 2000/10,000/30,000/70,000/200,000/700,000/2,000,000/4,000,000/10,000,000.

Preferred examples of the thermoplastic resin include PARACRON KG-3015P available from Negami Chemical Industrial Co., Ltd.

Meanwhile, the thermoplastic resin may be contained in an amount of 40 parts by weight to 90 parts by weight based on 100 parts by weight of the total of the amine compound and the thermosetting resin. Preferably, the thermoplastic resin may be contained in an amount of 41 parts by weight to 80 parts by weight, 42 parts by weight to 70 parts by weight, or 42.7 parts by weight to 67 parts by weight, based on 100 parts by weight of the total of the amine compound and the thermosetting resin. If the content of the thermoplastic resin is less than 40 parts by weight, there is a problem that the flow property of the resin is too high and thus the thickness deviation is increased. If the content of the thermoplastic resin is more than 90 parts by weight, there is a problem that the flow property is too small and thus the filling property of the pattern is deteriorated.

In addition, the thermosetting resin composition for coating a metal thin film may include an inorganic filler.

As the inorganic filler, those commonly used for the thermosetting resin composition for coating a metal thin film can be used without limitation, and specific examples thereof include one or more selected from the group consisting of silica, aluminum trihydroxide, magnesium hydroxide, molybdenum oxide, zinc molybdate, zinc borate, zinc stannate, alumina, clay, kaolin, talc, calcined kaolin, calcined talc, mica, short glass fiber, glass fine powder, and hollow glass.

The thermosetting resin composition for coating a metal thin film may include the inorganic filler in an amount of 200 parts by weight to 500 parts by weight, 205 parts by weight to 450 parts by weight, or 210 parts by weight to 400 parts by weight, based on 100 parts by weight the total of the amine compound and the thermosetting resin. When the content of the inorganic filler is too small, the coefficient of thermal expansion is increased and thus a warpage phenomenon is aggravated during a reflow process, and the stiffness of the printed circuit board is reduced.

In addition, when the surface-treated filler is used, a packing density may be increased by using a small size of the nanoparticle size and a large size of the microparticle size together, thereby increasing the filling rate.

The inorganic filler may include two or more types of inorganic fillers having different average particle sizes. Specifically, at least one of the two or more types of inorganic fillers may be an inorganic filler having an average particle size of 0.1 μm to 100 μm, and the other one may be an inorganic filler having an average particle size of 1 nm to 90 nm.

The content of the inorganic filler having an average particle size of 1 nm to 90 nm may be 1 part by weight to 30 parts by weight based on 100 parts by weight of the inorganic filler having an average particle size of 0.1 μm to 100 μm.

The inorganic filler may be silicas that are surface-treated with a silane coupling agent from the viewpoint of improving moisture resistance and dispersibility.

As a method of surface-treating the inorganic filler, a method of treating silica particles by a dry method or a wet method using a silane coupling agent as a surface treatment agent can be used. For example, silica that is surface-treated by a wet method using a silane coupling agent in an amount of 0.01 parts by weight to 1 part by weight based on 100 parts by weight of silica particles can be used.

Specific examples of the silane coupling agent include an aminosilane coupling agent such as 3-aminopropyltriethoxysilane, N-phenyl-3-aminopropyltrimethoxysilane, and N-2-(aminoethyl)-3-aminopropyltrimethoxysilane, an epoxy silane coupling agent such as 3-glycidoxypropyltrimethoxysilane, a vinyl silane coupling agent such as 3-methacryloxypropyl trimethoxysilane, a cationic silane coupling agent such as N-2-(N-vinylbenzylaminoethyl)-3-aminopropyltrimethoxysilane hydrochloride, and a phenylsilane coupling agent. The silane coupling agent can be used alone, or if necessary, at least two silane coupling agents can be used in combination.

More specifically, the silane compound may include aromatic aminosilane or (meth)acrylsilane. As the inorganic filler having an average particle size of 0.1 μm to 100 μm, silicas treated with aromatic amino silane can be used, and as the inorganic filler having the average particle size of 1 nm to 90 nm, silicas treated with (meth)acryl silane can be used. A specific example of the silicas surface-treated with an aromatic aminosilane includes SC2050MTO (available from Admatechs), a specific example of the (meth)acrylsilane-treated silica may include AC4130Y (available from Nissan Chemical). The (meth)acryl means including both acrylic or methacrylic.

The thermosetting resin composition for coating a metal thin film can be used as a solution by adding a solvent if necessary. If the solvent exhibits good solubility for the resin component, the type thereof is not particularly limited, and alcohols, ethers, ketones, amides, aromatic hydrocarbons, esters, nitriles, and the like can be used. These can be used alone, or a mixed solvent of two or more thereof can be used.

In addition, the thermosetting resin composition for coating a metal thin film may further include various polymeric compounds such as other thermosetting resins, thermoplastic resins, and oligomers and elastomers thereof, and other flame retardant compounds or additives, as long as the inherent characteristics of the resin composition are not impaired. These are not particularly limited as long as they are selected from those that are commonly used in the art. Examples of the additives include ultraviolet absorbers, antioxidants, photopolymerization initiators, fluorescent brightening agents, photosensitizers, pigments, dyes, thickeners, lubricants, antifoaming agents, dispersants, leveling agents, and brighteners. The composition can used by mixing them so as to match the purpose.

Examples of the other thermosetting resins include an epoxy resin. As the epoxy resin, the type thereof is not limited, but a bisphenol A type of epoxy resin, a phenol novolac type of epoxy resin, a phenyl aralkyl type of epoxy resin, a tetraphenyl ethane type of epoxy resin, a naphthalene type of epoxy resin, a mixture thereof, etc.

Specifically, the epoxy resin may include one or more selected from the group consisting of a bisphenol A type of epoxy resin represented by the following Chemical Formula 5, a novolac type of epoxy resin represented by the following Chemical Formula 6, a phenylaralkyl type of epoxy resin represented by the following Chemical Formula 7, a tetraphenyl ethane type of epoxy resin represented by the following Chemical Formulas 8, and a naphthalene type of epoxy resin represented by the following Chemical Formulae 9 and 10.

[Chemical Formula 5]

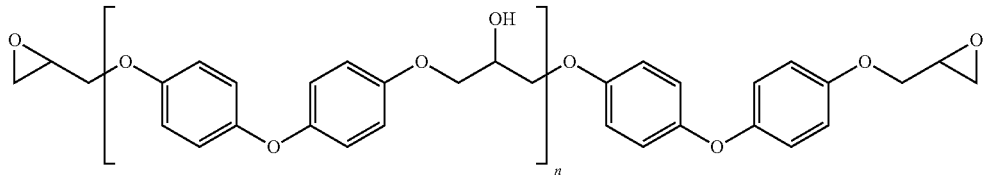

In Chemical Formula 5,

R is

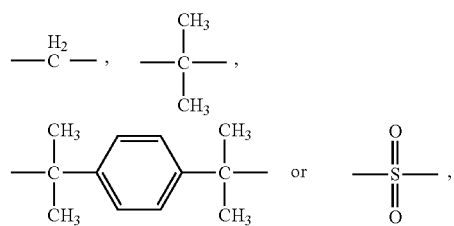

and n is an integer of 0 or 1 to 50.

More specifically, the epoxy resin of Chemical Formula 5 may be a bisphenol-A type of epoxy resin, a bisphenol-F type of epoxy resin, a bisphenol-M type of epoxy resin, or a bisphenol-S type of epoxy resin, respectively, depending on the type of R.

[Chemical Formula 6]

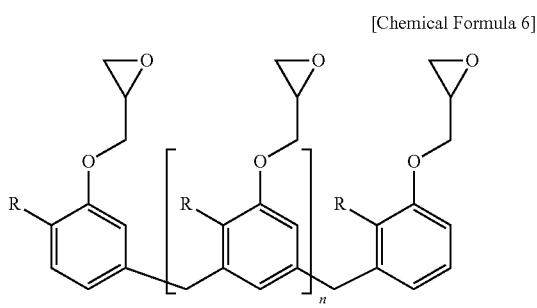

In Chemical Formula 6,
R is H or CH$_3$, and
n is an integer of 0 or 1 to 50.

More specifically, the novolac type of epoxy resin of Chemical Formula 6 may be a phenol novolac type of epoxy resin or a cresol novolac type of epoxy resin, respectively, depending on the type of R.

[Chemical Formual 7]

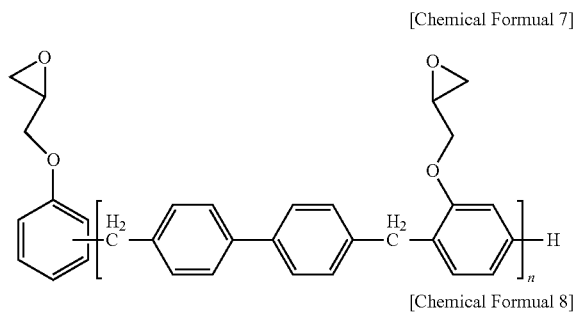

[Chemical Formual 8]

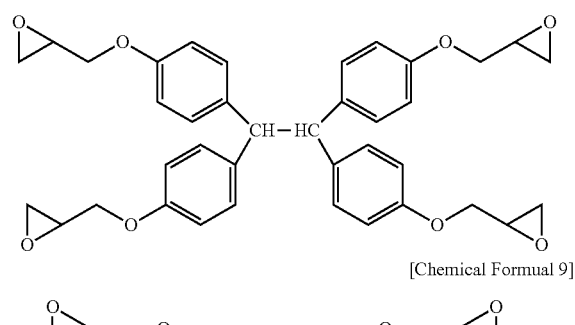

[Chemical Formual 9]

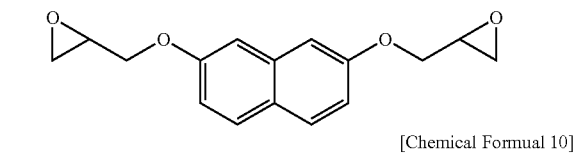

[Chemical Formual 10]

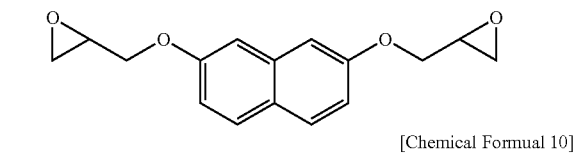

Meanwhile, the thermosetting resin composition for coating a metal thin film may include the amine compound described above, and may further include an additional curing agent other than the amine compound.

A resin-coated metal thin film can be manufactured by a simple method in which the above-described respective components are mixed to produce a coating varnish, which is then coated on a metal foil, followed by curing and drying.

The thermosetting resin composition for coating a metal thin film having such a configuration may satisfy a complex viscosity condition of 2000 Pa·s or less in the rheometer lowest viscosity window in the range of 120° C. to 180° C.

That is, assuming that the complex viscosity suitable for filling the pattern is 2000 Pa·s or less, in the case of the resin composition presented in the present invention, the temperature window satisfying the viscosity condition is as wide as 120° C. to 180° C. That is, the flow property in the lamination process section is high and thus no empty space is generated after the resin lamination, and the filling property of the pattern is excellent.

As the thermosetting resin composition for coating a metal thin film has the excellent resin flow property as described above, it is possible to secure a flow property during the process of preparation or build-up of a metal thin film or a metal laminate using the metal thin film, thereby easily filling a fine pattern and improving the crack resistance of the thin film.

The thickness of the cured product used as the insulation pattern may be 15 μm or less, 10 μm or less, 1 μm to 15 μm, 1 μm to 10 μm, 5 μm to 10 μm, or 6 μm to 8 μm.

(2) Resist Pattern Layer

The multilayered printed circuit board may include a resist pattern layer formed on upper and lower surfaces of the resin laminate. The resist pattern layer may include a resist pattern having an opening pattern. The resist pattern refers to a resist block obtained through partial etching of a resist layer in a method of manufacturing a multilayered printed circuit board described hereinafter.

The resist pattern layer is formed on the upper and lower surfaces of the resin laminate, and even during the manufacture of ultra-thin multilayer printed circuit boards, it is possible to prevent breakage of a product such as tearing and thus achieve excellent durability.

Examples of the resist included in the resist pattern layer include an alkali-soluble or non-thermosetting photosensitive dry film resist (DFR). The resist pattern layer may have a thickness of 1 μm to 20 μm, 5 μm to 15 μm, or 9 μm to 10 μm.

II. Manufacturing Method of Multilayered Printed Circuit Board

According to another embodiment of the present invention, a method for manufacturing a multilayered printed circuit board is provided, including: a first step of laminating a metal layer on both surfaces of a carrier film to form a pattern; a second step of laminating an insulating layer on the metal layer to form a pattern; a third step of laminating a metal layer on the insulating layer to form a pattern; a fourth step of forming a resist layer on the metal layer; and a fifth step of peeling the carrier film from metal layer of the first step and laminating a resist layer on the surface of the peeled metal layer to form a pattern, wherein the insulating layer includes a resin-coated metal thin film having a thickness of 15 μm or less, and wherein, after the third step, the second and third steps are repeated one or more times.

The multilayered printed circuit board of one embodiment may be obtained by the method for manufacturing the multilayered printed circuit board of the other embodiment.

In the method of manufacturing the multilayered printed circuit board, the carrier film is used as a temporary core layer, the metal layer and the insulating layer are repeatedly laminated/patterned, respectively, on the upper and lower surfaces of the carrier film, and then the carrier film is removed, thereby forming two resin laminates (panels) in a single process.

In particular, as a resin-coated metal thin film having a thickness of 15 μm or less is applied as an insulating layer used when manufacturing a resin laminate, the total thickness of the resin laminate can be significantly reduced, thereby increasing the applicability to thinned and highly integrated semiconductor devices. In addition, the resin-coated metal thin film includes, together with a resin layer having insulation properties, a metal thin film on the surface of the resin layer. Thus, in the process of forming the metal layer after forming the insulating layer, the metal layer may be easily laminated without introducing a separate seed layer.

In addition, in order to prevent breakage of the resin laminate from occurring in the process of removing the carrier film, the resist layer coating process is performed twice, in which a resist layer is formed on the top of the resin laminate before removing the carrier film, and a resist layer is additionally formed on the rest of the resin laminate after removal of the carrier film, thereby improving the durability of the resin laminate.

Specifically, the first step is a step of laminating a metal layer on both or opposing surfaces of a carrier film to form a pattern. The carrier film is a base film that serves as a support for laminating a metal layer and an insulating layer, wherein a metal layer may be laminated on one surface of the carrier film and an opposite surface facing the carrier film.

Examples of the metal contained in the metal layer include metals such as gold, silver, copper, tin, nickel, aluminum, and titanium, or alloys containing a mixture of two or more thereof, and the thickness of the metal layer can be 1 μm to 20 μm, 5 μm to 15 μm, or 7 μm to 9 μm. If the thickness of the metal layer is excessively increased to more than 20 μm, excess metal is required to form the metal layer, and therefore the raw material cost is increased which may can cause economic efficiency to decline, and it may be difficult to apply to thinned and highly integrated semiconductor devices.

Specific examples of the carrier film are not particularly limited, and various organic and inorganic materials such as polymers, metals, and rubbers can be applied. As a specific example, plastic films such as a polyethylene terephthalate (PET) film, a polyester film, a polyimide film, a polyamideimide film, a polypropylene film, and a polystyrene film can be used. The thickness of the carrier film can be 10 μm to 100 μm.

As an example of a method of laminating a metal layer on both or opposing surfaces of the carrier film, a method including a step of forming a metal thin film on both or opposing surfaces of the carrier film, and a step of depositing a metal on the metal thin film, can be used.

Specifically, in the step of forming a metal thin film on both or opposing surfaces of the carrier film, a method of depositing metals such as gold, silver, copper, tin, nickel, aluminum, titanium, or an alloy containing a mixture of two or more thereof on the surface of the carrier film can be mentioned.

Examples of the deposition process include a dry deposition process and a wet deposition process. Specific examples of the di deposition process include vacuum vapor deposition, ion plating, sputtering, and the like. Specific examples of the wet deposition process include electroless plating of various metals and the like. More specifically, the electroless copper plating can be used. In addition, a roughening treatment process can be further included before or after vapor deposition.

In the step of depositing a metal on the metal thin film, the vapor deposition method described above can be similarly applied.

Examples of a method of forming a pattern on the metal layer are not particularly limited, but for example, a method including a step of forming a patterned photosensitive resin layer on the metal layer, and a step of removing a metal layer exposed by the patterned photosensitive resin layer can be used.

In the step of forming a patterned photosensitive resin layer on the metal layer, the photosensitive resin layer may be laminated on the metal layer in a state where a pattern is formed, or a pattern may be formed after being laminated. More preferably, a pattern may be formed after being laminated on the metal layer. Examples of the photosensitive resin layer include an alkali-soluble or non-thermosetting photosensitive dry film resist (DFR), and the like.

The method of forming a photosensitive resin layer on the metal layer is not particularly limited, and for example, a method of laminating a photosensitive resin in the form of a film, such as a photosensitive dry film resist, on a metal layer, or a method of coating the photosensitive resin composition onto a metal layer by a spray method or a dipping method, followed by pressing, and the like may be used.

The step of forming the patterned photosensitive resin layer on the metal layer may include a step of exposing and alkali-developing the photosensitive resin layer formed on the metal layer. In this case, the photosensitive resin layer may be used as a protective layer or a patterning mask for the metal layer.

In the step of exposing and alkali-developing the photosensitive resin layer formed on the metal layer, the thickness of the photosensitive resin layer formed on the metal layer may be 3 μm to 60 μm, or 5 μm to 30 μm. When the thickness of the photosensitive resin layer is excessively increased to more than 60 μm, the resolution may be lowered.

Examples of the method of exposing the photosensitive resin layer are not particularly limited, but for example, the exposure can be selectively performed though a process of contacting a photomask having a predetermined pattern formed on the photosensitive resin layer and then irradiating ultraviolet rays, a process of imaging a predetermined pattern included in the mask through a projection objective lens and then irradiating ultraviolet rays, a process of directly imaging a pattern using a laser diode as a light source and then irradiating ultraviolet rays, or the like. At this time, an example of the ultraviolet irradiation condition may include irradiating a light amount of 5 mJ/cm$^2$ to 600 mJ/cm$^2$.

Further, examples of the process of developing the photosensitive resin layer may include a process of treating with an alkaline developer. Examples of the alkaline developer are not particularly limited, but for example, an alkaline aqueous solution such as potassium hydroxide, sodium hydroxide, sodium carbonate, potassium carbonate, sodium phosphate, sodium silicate, ammonia, tetramethylammonium hydroxide, amines, and the like can be used, and preferably, a 1% aqueous sodium carbonate solution (30° C.) may be used. The specific use amount of the alkaline developer is not particularly limited.

In the step of removing the metal layer exposed by the photosensitive resin layer pattern, the photosensitive resin pattern is used to serve as a resist for forming a pattern on the metal layer. Therefore, the metal layer exposed by the photosensitive resin layer pattern means a portion of the metal layer whose surface is not in contact with the photosensitive resin layer.

Specifically, the step of removing the metal layer exposed by the photosensitive resin layer pattern may include a step in which the etchant passes through the photosensitive resin layer having the pattern formed thereon and comes into contact with the metal layer.

The etchant may be selected depending on the kind of the metal layer, and it is preferable to use materials that do not affect the photosensitive resin layer.

The second step is a step of laminating an insulating layer on the metal layer to form a pattern. The metal layer in the second step means a metal layer on which a pattern is formed after the first step.

The insulating layer formed on the metal layer may include a resin-coated metal thin film having a thickness of 15 µm or less. Specifically, the thickness of the resin-coated metal thin film may be 15 µm or less, 10 µm or less, 1 µm to 15 µm, 1 µm to 10 µm, 5 µm to 10 µm, or 8 µm to 10 µm. When the thickness of the resin-coated metal thin film is excessively increased, excess insulation material is required to form an insulating layer, and therefore the raw material cost may increase which may cause economic efficiency to decline, and it may be difficult to apply to thinned and highly integrated semiconductor devices.

The resin-coated metal thin film includes a metal foil, a resin cured product formed on at least one surface of the metal foil, and an inorganic filler dispersed within the cured resin, wherein the resin cured product may be a cured product between: an amine compound containing one or more functional groups selected from the group consisting of i) a sulfone group, a carbonyl group, a halogen group, an alkyl group having 1 to 20 carbon atoms which is unsubstituted or substituted by a nitro group, a cyano group, or a halogen group, ii) an aryl group having 6 to 20 carbon atoms which is unsubstituted or substituted by a nitro group, a cyano group, or a halogen group, iii) a heteroaryl group having 2 to 30 carbon atoms which is unsubstituted or substituted by a nitro group, a cyano group, or a halogen group, and iv) an alkylene group having 1 to 20 carbon atoms which is unsubstituted or substituted by a nitro group, a cyano group, or a halogen group; a thermosetting resin; and a thermoplastic resin.

Moreover, the resin-coated metal thin film includes a metal foil, and a resin cured product formed on at least one surface of the metal foil, wherein the cured product is a cured product of the thermosetting resin composition for coating a metal thin film which includes: an amine compound containing one or more functional groups selected from the group consisting of i) a sulfone group, a carbonyl group, a halogen group, an alkyl group having 1 to 20 carbon atoms which is unsubstituted or substituted by a nitro group, a cyano group, or a halogen group, ii) an aryl group having 6 to 20 carbon atoms which is unsubstituted or substituted by a nitro group, a cyano group, or a halogen group, iii) a heteroaryl group having 2 to 30 carbon atoms which is unsubstituted or substituted by a nitro group, a cyano group, or a halogen group, and iv) an alkylene group having 1 to 20 carbon atoms which is unsubstituted or substituted by a nitro group, a cyano group, or a halogen group; a thermosetting resin; a thermoplastic resin; and an inorganic filler, wherein the thermoplastic resin is included in an amount of 40 parts by weight to 90 parts by weight based on 100 parts by weight of the total of the amine compound and the thermosetting resin, and wherein the thermosetting resin composition has a complex viscosity of 2000 Pa·s or less in the range of 120° C. to 180° C.

The metal foil includes a copper foil, an aluminum foil, a composite foil having a three-layer structure containing nickel, nickel-phosphorus, a nickel-tin alloy, a nickel-iron alloy, lead, or a lead-tin alloy as an intermediate layer, and containing copper layers having different thicknesses on both sides thereof; or a composite foil having a two-layer structure in which aluminum and copper foil are combined, can be used.

According to a preferred embodiment, the metal foil used in the present invention is a copper foil or an aluminum foil, and those having a thickness of about 2 µm to 200 µm can be used, but those having a thickness of about 2 µm to 35 µm are preferred. Preferably, a copper foil is used as the metal foil. In addition, according to the present invention, a composite foil having a three-layer structure containing nickel, nickel-phosphorus, a nickel-tin alloy, a nickel-iron alloy, lead, a lead-tin alloy, etc. as an intermediate layer, and containing a copper layer of 0.5 µm to 15 µm and a copper layer of 10 µm to 300 µm on both sides thereof, or a composite foil having a two-layer structure in which aluminum and a copper foil are combined, can be used as the metal foil.

The resin cured product may have a thickness of 15 µm or less, 10 µm or less, 1 µm to 15 µm, 1 µm to 10 µm, 5 µm to 10 µm, or 6 µm to 8 µm. Such a cured product can be made to exhibit excellent thermal and mechanical properties with respect to the metal foil, even if the thickness is thinly formed on the metal foil. When the thickness of the cured product increases or decreases by a specific value, the physical property measured in the resin-coated metal thin film may also change by a certain value.

Meanwhile, the details of the resin-cured product include those described above with reference to the embodiment.

The resin-coated metal thin film can be formed a process including a step of coating a thermosetting resin composition for coating a metal thin film onto the metal thin film, and a step of curing the thermosetting resin composition coated onto the metal thin film.

In one embodiment, the resin-coated metal thin film can be manufactured by a simple method in which the components described above with reference to the thermosetting resin composition for coating a metal thin film are mixed to produce a coating varnish which is then coated on metal foil, followed by curing and drying. Further, the curing reaction of the resin is adjusted to lengthen the window where the lowest viscosity is maintained within the temperature window of the lamination process. Preferably, the curing may be performed at a temperature of 180° C. to 250° C. for 1 to 4 hours.

In addition, the method of coating, the thermosetting resin composition for coating a metal thin film onto the metal foil is not particularly limited, and a coating method commonly known in the art may be used.

As an example, a method may be used in which a thermosetting resin composition for coating a metal thin film is placed on a metal foil in a coating device and coated with a certain thickness. As the coating device, a comma coater, a blade coater, a lip coater, a rod coater, a squeeze coater, a reverse coater, a transfer roll coater, a gravure coater, a spray coater, or the like can be used.

In addition, a carrier film can be used for evaluating the flow property, and as the carrier film, plastic films such as a polyethylene terephthalate (PET) film, a polyester film, a polyimide film, a polyamideimide film, a polypropylene film, a polystyrene film, and the like can be used.

Meanwhile, an example of a method of forming a pattern on the insulating layer is not particularly limited, but for example, $CO_2$ or YAG laser drilling may be used as a processing method using a laser.

The third step is a step of laminating a metal layer on the insulating layer to form a pattern. The insulating layer in the third step means an insulating layer on which a pattern is formed after the second step.

A specific method of laminating a metal layer on the insulating layer to form a pattern is the same as in the first step.

Meanwhile, after the third step, the second step and the third step may be repeatedly performed one or more times. In other words, it is possible to perform one repeating process in which, after the third step, the second step is performed again and then the third step is performed. As the second step and the third step are repeated multiple times, a multilayer buildup film may be formed in the resin laminate.

The fourth step is a step of forming a resist layer on the metal layer. In order to prevent breakage of the resin laminate from occurring in the fifth step of removing the carrier film as described above, in the fourth step which is prior to removing the carrier film, a resist layer may be formed on the top of the resin laminate to improve durability of the resin laminate.

Examples of the resist layer include an alkali soluble or non-thermosetting photosensitive dry film resist (DFR) or the like. The resist layer may have a thickness of 1 µm to 20 µm, 5 µm to 15 µm, or 9 µm to 10 µm.

The fifth step is a step of peeling the carrier film from metal layer of the first step and laminating a resist layer on the surface of the peeled metal layer to form a pattern.

In particular, the bonding force between the carrier film and the metal layer in the first step is smaller than the bonding force between the metal layer and the insulating layer in the second step. Thus, even after the metal layer is bonded to one surface of the carrier film, physical peeling between them can be performed, so that the carrier film can be easily removed. This is probably because the adhesion of the insulating layer to the metal is improved due to the component characteristics of the insulation material used for the insulating layer.

A resist layer can be laminated on the surface of the peeled metal layer, and examples of the resist layer include an alkali-soluble or non-thermosetting photosensitive dry film resist (DFR) or the like. The resist layer may have a thickness of 1 µm to 20 µm, 5 µm to 15 µm, or 9 µm to 10 µm.

After laminating the resist layer, a pattern may be formed on the resist layer. The resist layer forming the pattern may be all of the resist layers included in the upper and lower surfaces of the resin laminate or at least one of them.

As an example of the method of forming a pattern on the resist layer, exposure and alkali-development may be mentioned. Examples of the method of exposing the resist layer are not particularly limited, but for example, the exposure can be selectively performed through a process of contacting a photomask having a predetermined pattern formed on the photosensitive resin layer and then irradiating ultraviolet rays, a process of imaging a predetermined pattern included in the mask through a projection objective lens and then irradiating ultraviolet rays, or a process of directly imaging a pattern using a laser diode as a light source and then irradiating ultraviolet rays, or the like. At this time, an example of the ultraviolet irradiation condition may include irradiating a light amount of 5 $mJ/cm^2$ to 600 $mJ/cm^2$.

Further, examples of the process of developing the resist layer may include a process of treating with an alkaline developer. Examples of the alkaline developer are not particularly limited, but for example, an alkaline aqueous solution such as potassium hydroxide, sodium hydroxide, sodium carbonate, potassium carbonate, sodium phosphate, sodium silicate, ammonia, tetramethylammonium hydroxide, amines, and the like can be used, and preferably, a 1% aqueous sodium carbonate solution (30° C.) may be used. The specific use amount of the alkaline developer is not particularly limited.

III. Semiconductor Device

According to still another embodiment of the present invention, a semiconductor device is provided, including the multilayered printed circuit board according to the above-described embodiments. The details of the multilayered printed circuit board included in the semiconductor device include those described above with reference to the embodiments.

The multilayered printed circuit board can be introduced into a semiconductor device by a known method. Since the multilayered printed circuit board is made ultra-thin and has strong durability, it can be applied to thinned and highly integrated semiconductor devices.

According to the present invention, a multilayered printed circuit board having excellent durability while having a thin thickness, a method for manufacturing the same, and a semiconductor device using the same, can be provided.

EXAMPLES

Hereinafter, the present invention is described in further detail with reference to examples. However, these examples are for illustrative purposes only and are not intended to limit the scope of the present invention.

Preparation Example: Manufacture of Insulating Layer

Preparation Example 1: Resin-Coated Copper Foil (1) Preparation of Thermosetting Resin Composition for Coating Metal Thin Film In accordance with the composition shown in Table 1 below, each component was added to methyl ethyl ketone in conformity to a solid content of 40% and mixed, then stirred at room temperature at a speed of 400 rpm for one day. Viscosity adjustment and defoaming were then performed using a rotary evaporator to prepare a resin composition (resin varnish) for coating a metal thin film.

(2) Preparation of Resin-Coated Copper Foil

The resin composition for coating a metal thin film was coated onto a copper foil (thickness 2 µm, manufactured by Mitsui) with a comma coater (coating thickness: 6 µm), and then cured for 100 minutes under conditions of 220° C. and 35 $kg/cm^2$. Then, it was cut into a size of 17 cm×15 cm to prepare a resin-coated copper foil of Preparation Example 1.

Preparation Example 2: Resin-Coated Copper Foil (1) Preparation of Thermosetting Resin Composition for Coating Metal Thin Film In accordance with the composition shown in Table 1 below, each component was added to methyl ethyl ketone in conformity to a solid content of 40% and mixed, then stirred at room temperature at a speed of 400 rpm for one day. Viscosity adjustment and defoaming were then performed using a rotary evaporator to prepare a resin composition (resin varnish) for coating a metal thin film.

(2) Preparation of Resin-Coated Copper Foil

The resin composition for coating a metal thin film was coated onto a copper foil (thickness 2 μm, manufactured by Mitsui) with a comma coater (coating thickness: 8 μm), and then cured for 100 minutes under conditions of 220° C. and 35 kg/cm². Then, it was cut into a size of 17 cm×15 cm to prepare a resin-coated copper foil of Preparation Example 2.

Preparation Example 3: Prepreg (1) Preparation of Thermosetting Resin Composition In accordance with the composition shown in Table 1 below, each component was added to methyl ethyl ketone in conformity to a solid content of 40% and mixed, then stirred at room temperature at a speed of 400 rpm for one day. Viscosity adjustment and defoaming were then performed using a rotary evaporator to prepare a resin composition (resin varnish) for coating a metal thin film.

(2) Preparation of Prepreg

The stirred varnish was impregnated into a woven glass fiber (thickness 12 μm, manufactured by Asahi Glass), followed by hot air drying at a temperature of 180° C. for 2 minutes to prepare a prepreg having a thickness of 16 μm.

Preparation Example 4: Prepreg (1) Preparation of Thermosetting Resin Composition In accordance with the composition shown in Table 1 below, each component was added to methyl ethyl ketone in conformity to a solid content of 40% and mixed, then stirred at room temperature at a speed of 400 rpm for one day. Viscosity adjustment and defoaming were then performed using a rotary evaporator to prepare a resin composition (resin varnish) for coating a metal thin film.

(2) Preparation of Prepreg

The stirred varnish was impregnated into a woven glass fiber (thickness 12 μm, manufactured by Asahi Glass), followed by hot air drying at a temperature of 180° C. for 2-5 minutes to prepare a prepreg having a thickness of 18 μm.

TABLE 1

Composition of the thermosetting resin composition for coating metal thin film of preparation example (unit: g)

| Component | | | Content |
|---|---|---|---|
| Thermosetting resin | Epoxy resin | XD-1000 | 37 |
| | | NC-3000H | 11 |
| | Bismaleimide resin | BMI-2300 | 2 |
| Diamine compound | | DDS | 20 |
| Thermoplastic resin | | Acrylic rubber | 30 |
| Inorganic filler | | SC2050MTO | 135 |
| | | AC4130Y | 15 |

* XD-1000: epoxy resin (Nippon Kayaku; epoxy equivalent 253 g/eq)
* NC-3000H: epoxy resin (Nippon Kayaku; epoxy equivalent 290 g/eq)
* BMI-2300: bismaleimide-based resin (DAIWA KASEI; maleimide equivalent 179 g/eq)
* DDS: 4,4'-diaminodiphenyl sulfone (active hydrogen equivalent 62 g/eq)
* Acrylic rubber(Mw 800,000): PARACRON KG-3015P (Negami Chemical Industrial Co., LTD.)

Preparation Examples 5 and 6: Resin-Coated Copper Foil (1) Preparation of Thermosetting Resin Composition for Coating Metal Thin Film In accordance with the composition shown in Table 2 below, each component was added to methyl ethyl ketone in conformity to a solid content of 40% and mixed, then stirred at room temperature at a speed of 400 rpm for one day. Viscosity adjustment and defoaming were then performed using a rotary evaporator to prepare a resin composition (resin varnish) for coating a metal thin film.

(2) Preparation of Resin-Coated Copper Foil

The resin composition for coating a metal thin film was coated onto a copper foil (thickness 2 μm, manufactured by Mitsui) with a comma coater (coating thickness: 6 μm), and then cured for 100 minutes under conditions of 220° C. and 35 kg/cm². Then, it was cut into a size of 17 cm×15 cm to prepare a resin-coated copper foil of Preparation Examples 5 and 6.

TABLE 2

Composition of the thermosetting resin composition for coating metal thin film of Preparation Examples 5 and 6 (unit: g)

| Category | | | Preparation Example 5 | Preparation Example 6 |
|---|---|---|---|---|
| Thermosetting resin | Epoxy resin | XD-1000 | 37 | 37 |
| | | NC-3000H | 11 | 11 |
| | Bismaleimide resin | BMI-2300 | 2 | 2 |
| Diamine compound | | DDS | 20 | 20 |
| Thermoplastic resin | | Acrylic rubber | 70 | 10 |
| Inorganic filler | | SC2050MTO | 135 | 135 |
| | | AC4130Y | 15 | 15 |

After the copper foil was etched and removed from the resin-coated copper foils of Preparation Examples 1 and 5, the rheometer viscosity was measured (viscosity measurement conditions according to temperature, a heating rate of 5° C./min, frequency: 10 Hz).

As a result, the resin layer of Preparation Example 1 had a temperature window of 120 to 180° C. corresponding to a complex viscosity of 2000 Pa·s or less, while the resin layer of Preparation Example 5 had no temperature window corresponding to a complex viscosity of 2000 Pa·s or less.

In addition, after the copper foil was etched and removed from the resin-coated copper foils of Preparation Examples 1 and 6, the tensile elongation in the MD direction was measured using a Universal Testing Machine (Instron 3365) according to IPC-TM-650 (2.4.18.3).

As a result, it was confirmed that the resin layer of Preparation Example 1 had a tensile elongation of 3.8%, whereas the resin layer of Preparation Example 6 had tensile elongation of 0.9%, which is very low compared to the examples.

Example: Manufacture of Multilayered Printed Circuit Boards

Example 1

As shown in FIG. 1, a multilayered printed circuit board was manufactured according to the following sequence of steps.

<1> Ultra-thin copper foils M0 and M0' having a thickness of 5 μm were laminated on both surfaces of the carrier film C having a thickness of 50 to 100 μm.

<2> Subsequently, copper (Cu) metal was deposited in a thickness of 0.5 μm on the surface of the ultra-thin copper foil M0 by a sputtering method while supplying a mixed gas of argon and oxygen with a deposition apparatus, and thereby a seed layer was formed, and a 9 μm thick copper foil layer M1 was formed through electrolytic plating.

A photosensitive dry film resist KL1015 (manufactured by Kolon Industries) having a thickness of 15 μm was laminated on the copper foil layer M1 at 110° C. A circular negative photomask with a diameter of 30 μm was brought into contact with the photosensitive dry film resist and irradiated with ultraviolet rays (light amount of 25 mJ/cm$^2$), and then the photosensitive dry film resist was developed at 30° C. by a 1% sodium carbonate developer. At this time, the exposed copper foil layer M1 was removed by etching to form a pattern. Then, the remaining photosensitive dry film resist was removed using a 3% sodium hydroxide resist peeling liquid at a temperature of 50° C.

The 8 μm thick resin-coated copper foil obtained by Preparation Example 1 was laminated on the copper foil layer M1 as the insulating layer D12. At this time, the resin layer of the resin-coated copper foil was bonded to the copper foil layer M1.

Subsequently, the insulating layer D12 was thermally cured at a temperature of 200° C. for 1 hour, and then etched by $CO_2$ laser drilling to form a via hole.

Subsequently, copper (Cu) metal was deposited in a thickness of 0.5 μm on the surface of the via hole by a sputtering method while supplying a mixed gas of argon and oxygen with a deposition apparatus, and thereby a seed layer was formed, and a 7 μm thick copper foil layer M2 was formed through electrolytic plating.

A photosensitive dry film resist KL1015 (manufactured by Kolon Industries) having a thickness of 15 μm was laminated on the copper foil layer M2 at 110° C. A circular negative photomask with a diameter of 30 μm was brought into contact with the photosensitive dry film resist and irradiated with ultraviolet rays (light amount of 25 mJ/cm$^2$), and then the photosensitive dry film resist was developed at 30° C. by a 1% sodium carbonate developer. At this time, the exposed copper foil layer M2 was removed by etching to form a pattern. Then, the remaining photosensitive dry film resist was removed using a 3% sodium hydroxide resist peeling liquid at a temperature of 50° C.

Subsequently, the 10 μm thick resin-coated copper foil obtained by Preparation Example 2 was laminated on the copper foil layer M2 as the insulating layer D23. At this time, the resin layer of the resin-coated copper foil was bonded to the copper foil layer M2.

Then, the insulating layer D23 was thermally cured at a temperature of 200° C. for 1 hour and then etched by $CO_2$ laser drilling to form a via hole.

Subsequently, on the surface of the via hole, titanium (Ti) metal was deposited in a thickness of 50 nm and copper (Cu) metal was deposited in a thickness of 0.5 μm by a sputtering method while supplying a mixed gas of argon and oxygen with a deposition apparatus, and thereby a seed layer was formed, and a 9 μm thick copper foil layer M3 was formed through electrolytic plating.

A photosensitive dry film resist KL1015 (manufactured by Kolon Industries) having a thickness of 15 μm was laminated on the copper foil layer M3 at 110° C. A circular negative photomask with a diameter of 30 μm was brought into contact with the photosensitive dry film resist and irradiated with ultraviolet rays (light amount of 25 mJ/cm$^2$), and then the photosensitive dry film resist was developed at 30° C. by a 1% sodium carbonate developer. At this time, the exposed copper foil layer M3 was removed by etching to form a pattern. Then, the remaining photosensitive dry film resist was removed using a 3% sodium hydroxide resist peeling liquid at a temperature of 50° C. to produce a first panel PN-1.

On the surface of the ultra-thin copper foil M0', a copper foil layer M1', an insulating layer D12', a copper foil layer M2', an insulating layer D23', and a copper foil layer M3' were sequentially laminated in the same manner as in the first panel to form a second panel PN-2.

<3> A photosensitive dry film resist KL1015 (manufactured by Kolon Industries) (SR BTM) having a thickness of 9 μm was laminated on the first panel PN-1 at 110° C. A photosensitive dry film resist KL1015 (manufactured by Kolon Industries) (SR BTM') having a thickness of 9 μm was laminated on the surface of the second panel (PN-2) at 110° C.

<4> The ultra-thin copper foil M0 and the carrier film C were separated and the carrier film was removed.

<5> The ultra-thin copper foil M0 on the surface of the first panel PN-1 was removed by etching, and a photosensitive dry film resist KL1015 (manufactured by Kolon Industries) (SR TOP) having a thickness of 9 μm was laminated at 110° C.

<6> A circular negative photomask with a diameter of 30 μm was brought into contact with the photosensitive dry film resist (SR TOP) and irradiated with ultraviolet rays (light amount of 25 mJ/cm$^2$), and then the photosensitive dry film resist (SR TOP) was developed at 30° C. by a 1% sodium carbonate developer to form a pattern.

A certain pattern was formed on the photosensitive dry film resist (SR BTM) in the same manner to manufacture a multilayered printed circuit board.

<7> The second panel (PN-2) was subjected to the steps <5> to <6> to manufacture a multilayer printed circuit board.

Example 2

A multilayered printed circuit board was manufactured according to the following sequence of steps.

<1> This step was performed in the same manner as in <1> of Example 1.

<2> Copper (Cu) metal was deposited in a thickness of 0.5 μm on the surface of the ultra-thin copper foil M0 by a sputtering method while supplying a mixed gas of argon and oxygen with a deposition apparatus, and thereby a seed layer was formed, and a 9 μm-thick copper foil layer M1 was formed through electrolytic plating.

A photosensitive dry film resist KL1015 (manufactured by Kolon Industries) having a thickness of 15 μm was laminated on the copper foil layer M1 at 110° C. A circular negative photomask with a diameter of 30 μm was brought into contact with the photosensitive dry film resist and irradiated with ultraviolet rays (light amount of 25 mJ/cm$^2$), and then the photosensitive dry film resist was developed at 30° C. by a 1% sodium carbonate developer. At this time, the exposed copper foil layer M1 was removed by etching to form a pattern. Then, the remaining photosensitive dry film resist was removed using a 3% sodium hydroxide resist peeling liquid at a temperature of 50° C.

The 8 μm thick resin-coated copper foil obtained by Preparation Example 1 was laminated on the copper foil layer M1 as the insulating layer D12. At this time, the resin layer of the resin-coated copper foil was bonded to the copper foil layer M1.

Subsequently, the insulating layer D12 was thermally cured at a temperature of 200° C. for 1 hour and then etched by $CO_2$ laser drilling to form a via hole.

Copper (Cu) metal was then deposited in a thickness of 0.5 μm on the surface of the via hole by a sputtering method while supplying a mixed gas of argon and oxygen with a deposition apparatus, and thereby a seed layer was formed, and an 8 μm thick copper foil layer M2 was formed through electrolytic plating.

A photosensitive dry film resist KL1015 (manufactured by Kolon Industries) having a thickness of 15 μm was laminated on the copper foil layer M2 at 110° C. A circular negative photomask with a diameter of 30 μm was brought into contact with the photosensitive dry film resist and irradiated with ultraviolet rays (light amount of 25 mJ/cm$^2$), and then the photosensitive dry film resist was developed at 30° C. by a 1% sodium carbonate developer. At this time, the exposed copper foil layer M2 was removed by etching to form a pattern. Then, the remaining photosensitive dry film resist was removed using a 3% sodium hydroxide resist peeling liquid at a temperature of 50° C.

The 8 μm thick resin-coated copper foil obtained by Preparation Example 1 was laminated on the copper foil layer M2 as the insulating layer D23. At this time, the resin layer of the resin-coated copper foil was bonded to the copper foil layer M2.

Subsequently, the insulating layer D23 was thermally cured at a temperature of 200° C. for 1 hour and then etched by $CO_2$ laser drilling to form a via hole.

Copper (Cu) metal was then deposited in a thickness of 0.5 μm on the surface of the via hole by a sputtering method while supplying a mixed gas of argon and oxygen with a deposition apparatus, and thereby a seed layer was formed, and an 8 μm thick copper foil layer M3 was formed through electrolytic plating.

A photosensitive dry film resist KL1015 (manufactured by Kolon Industries) having a thickness of 15 μm was laminated on the copper foil layer M3 at 110° C. A circular negative photomask with a diameter of 30 μm was brought into contact with the photosensitive dry film resist and irradiated with ultraviolet rays (light amount of 25 mJ/cm$^2$), and then the photosensitive dry film resist was developed at 30° C. by a 1% sodium carbonate developer. At this time, the exposed copper foil layer M3 was removed by etching to form a pattern. Then, the remaining photosensitive dry film resist was removed using a 3% sodium hydroxide resist peeling liquid at a temperature of 50° C.

Subsequently, the 10 μm thick resin-coated copper foil obtained by Preparation Example 2 was laminated on the copper foil layer M3 as the insulating layer D34. At this time, the resin layer of the resin-coated copper foil was bonded to the copper foil layer M3.

The insulating layer D34 was then thermally cured at a temperature of 200° C. for 1 hour and then etched by $CO_2$ laser drilling to form a via hole.

Subsequently, on the surface of the via hole, titanium (Ti) metal was deposited in a thickness of 0.5 um and copper (Cu) metal was deposited in a thickness of 0.5 μm by a sputtering method while supplying a mixed gas of argon and oxygen with a deposition apparatus, and thereby a seed layer was formed, and a 9 μm thick copper foil layer M4 was formed through electrolytic plating.

A photosensitive dry film resist KL1015 (manufactured by Kolon Industries) having a thickness of 15 μm was laminated on the copper foil layer M4 at 110° C. A circular negative photomask with a diameter of 30 μm was brought into contact with the photosensitive dry film resist and irradiated with ultraviolet rays (light amount of 25 mJ/cm$^2$), and then the photosensitive dry film resist was developed at 30° C. by a 1% sodium carbonate developer. At this time, the exposed copper foil layer M4 was removed by etching to form a pattern. Then, the remaining photosensitive dry film resist was removed using a 3% sodium hydroxide resist peeling liquid at a temperature of 50° C. to produce a first panel PN-1.

On the surface of the ultra-thin copper foil M0', a copper foil layer M1', an insulating layer D12', a copper foil layer M2', an insulating layer D23', a copper foil layer M3', an insulating layer D34', and a copper foil layer M4 were sequentially laminated in the same manner as in the first panel to form a second panel PN-2.

<3> to <7> These steps were performed in the same manner as in <3> to <7> of Example 1.

Comparative Example: Manufacture of Multilayered Printed Circuit Board

Comparative Example 1

A multilayered printed circuit board were manufactured in the same manner as in Example 1, except that, in step <2> of Example 1, the 16 μm thick prepreg (PPG) obtained in Preparation Example 3 was used instead of the 8 μm thick resin-coated copper foil obtained in Preparation Example 1 as the insulating layer D12, the 18 μm thick prepreg (PPG) obtained in Preparation Example 4 was used instead of the 10 μm thick resin-coated copper foil obtained in Preparation Example 2 as the insulating layer D23, and the thickness of each layer of the multilayered laminate was changed as shown in Table 3 below.

Comparative Example 2

Multilayered printed circuit boards were manufactured in the same manner as in Example 2, except that, in step <2> of Example 2, the 18 μm thick prepreg (PPG) obtained in Preparation Example 4 was used instead of the 8 μm thick resin-coated copper foil obtained in Preparation Example 1 as the insulating layer D12 and the insulating layer D23, the 18 μm thick prepreg (PPG) obtained in Preparation Example 4 was used instead of the 10 μm thick resin-coated copper foil obtained in Preparation Example 2 as the insulating layer D34, and the thickness of each layer of the multilayered laminate was changed as shown in Table 3 below.

TABLE 3

Thickness of the multilayered printed circuit boards of Examples and Comparative Examples (unit: μm)

| Category | Example 1 | Example 2 | Comparative Example 1 | Comparative Example 2 |
|---|---|---|---|---|
| Resist (SR TOP) | 9 | 10 | 10 | 12 |
| Copper foil layer(M1) | 9 | 9 | 10 | 13 |
| Insulating layer(D12) | 8 | 8 | 16 | 18 |
| Copper foil layer (M2) | 7 | 8 | 7 | 8 |
| Insulating layer (D23) | 10 | 8 | 18 | 18 |
| Copper foil layer (M3) | 9 | 8 | 10 | 8 |

TABLE 3-continued

Thickness of the multilayered printed circuit boards of
Examples and Comparative Examples (unit: μm)

| Category | Example 1 | Example 2 | Comparative Example 1 | Comparative Example 2 |
|---|---|---|---|---|
| Insulating layer (D34) | — | 10 | — | 18 |
| Copper foil layer M4) | — | 9 | — | 13 |
| Resist (SR BTM) | 9 | 10 | 10 | 12 |
| Multilayered printed circuit board | 61 | 80 | 81 | 120 |

As shown in Table 3, in the case of the examples using the resin-coated copper foil obtained in Preparation Example 1 and Preparation Example 2 as the insulating layer, the thickness of the multilayered printed circuit board of Example 1 including three copper foil layers was realized as thin as 61 μm, while the thickness of the multilayer printed circuit board of Example 2 including four copper foil layers was realized as thin as 80 μm, and also the problems such as breakage or tearing did not occur. On the other hand, in the case of the comparative examples using the prepregs obtained in Preparation Example 3 and Preparation Example 4 as the insulating layer, the thickness of the multilayered printed circuit board of Comparative Example 1 including three copper foil layers was 81 μm, and the thickness of the multilayered printed circuit board of Comparative Example 2 including four copper foil layers was 120 μm, which was limited in that it was measured very thickly compared to the examples.

The invention claimed is:

1. A multilayered printed circuit board comprising:
a resin laminate including a plurality of buildup layers;
each of the buildup layers comprising a resin-coated metal film having a thickness of 8 μm to 10 μm, and an insulation pattern and a metal pattern, wherein the insulation pattern has a thickness of 6 μm to 8 μm; and
a resist pattern layer formed on upper and lower surfaces of the resin laminate;
wherein the multilayered printed circuit board has a total thickness of 105 μm or less.

2. The multilayered printed circuit board according to claim 1, wherein
the insulation pattern includes a cured product of: an amine compound containing one or more functional groups selected from the group consisting of i) a sulfone group, a carbonyl group, a halogen group, an alkyl group having 1 to 20 carbon atoms which is unsubstituted or substituted by a nitro group, a cyano group, or a halogen group, ii) an aryl group having 6 to 20 carbon atoms which is unsubstituted or substituted by a nitro group, a cyano group, or a halogen group, iii) a heteroaryl group having 2 to 30 carbon atoms which is unsubstituted or substituted by a nitro group, a cyano group, or a halogen group, and iv) an alkylene group having 1 to 20 carbon atoms which is unsubstituted or substituted by a nitro group, a cyano group, or a halogen group; a thermosetting resin; a thermoplastic resin, and an inorganic filler dispersed within the cured product.

3. The multilayered printed circuit board according to claim 2, wherein
the thermosetting resin includes a dicyclopentadiene type epoxy resin and a biphenyl type epoxy resin.

4. The multilayered printed circuit board according to claim 3, wherein
the content of the biphenyl type epoxy resin is less than 100 parts by weight based on 100 parts by weight of the dicyclopentadiene type epoxy resin.

5. The multilayered printed circuit board according to claim 2, wherein
the thermosetting resin further includes one or more resins selected from the group consisting of a bismaleimide resin, a cyanate ester resin, and a bismaleimide-triazine resin.

6. The multilayered printed circuit board according to claim 2, wherein
the thermosetting resin is contained in an amount of 400 parts by weight or less based on 100 parts by weight of the amine compound.

7. The multilayered printed circuit board according to claim 2, wherein
an equivalent ratio calculated by the following Mathematical Equation 1 is 1.4 or more:

Equivalent ratio=Total active hydrogen equivalent weight contained in the amine compound/Total curable functional group equivalent weight contained in the thermosetting resin.  [Mathematical Equation 1]

8. The multilayered printed circuit board according to claim 2, wherein
the amine compound includes an aromatic amine compound containing 2 to 5 amino groups.

9. The multilayered printed circuit board according to claim 2, wherein
the thermoplastic resin includes a (meth)acrylate-based polymer.

10. The multilayered printed circuit board according to claim 9, wherein
the (meth)acrylate-based polymer is an acrylic ester copolymer containing a repeating unit derived from a (meth)acrylate-based monomer and a repeating unit derived from (meth)acrylonitrile; or an acrylic ester copolymer containing a repeating unit derived from butadiene.

11. The multilayered printed circuit board according to claim 9, wherein
the (meth)acrylate-based polymer has a weight average molecular weight of 500,000 to 1,000,000.

12. The multilayered printed circuit board according to claim 2, wherein
the content of the inorganic filler is 200 parts by weight to 500 parts by weight based on 100 parts by weight the total of the amine compound and the thermosetting resin.

13. The multilayered printed circuit board according to claim 2, wherein
the inorganic filler includes two or more types of inorganic fillers having different average particle sizes, and at least one of the two or more types of inorganic fillers is an inorganic filler having an average particle size of 0.1 μm to 100 μm, and the other one is an inorganic filler having an average particle size of 1 nm to 90 nm.

14. A semiconductor device comprising the multilayered printed circuit board according to claim 1.

15. A multilayered printed circuit board comprising:
a resin laminate including a plurality of buildup layers;
each of the buildup layers comprising a resin-coated metal film having a thickness of 8 μm to 10 μm, and an insulation pattern and a metal pattern, wherein the insulation pattern has a thickness of 6 μm to 8 μm; and a resist pattern layer formed on upper and lower surfaces of the resin laminate;

wherein the insulation pattern includes a cured product of a thermosetting resin composition for coating a metal thin film, including: an amine compound containing one or more functional groups selected from the group consisting of i) a sulfone group, a carbonyl group, a halogen group, an alkyl group having 1 to 20 carbon atoms which is unsubstituted or substituted by a nitro group, a cyano group, or a halogen group, ii) an aryl group having 6 to 20 carbon atoms which is unsubstituted or substituted by a nitro group, a cyano group, or a halogen group, iii) a heteroaryl group having 2 to 30 carbon atoms which is unsubstituted or substituted by a nitro group, a cyano group, or a halogen group, and iv) an alkylene group having 1 to 20 carbon atoms which is unsubstituted or substituted by a nitro group, a cyano group, or a halogen group; a thermosetting resin; a thermoplastic resin; and an inorganic filler, wherein the thermoplastic resin is included in an amount of 40 parts by weight to 90 parts by weight based on 100 parts by weight of the total of the amine compound and the thermosetting resin, and wherein the thermosetting resin composition has a complex viscosity of 2000 Pa·s or less in the range of 120° C. to 180° C.

16. The multilayered printed circuit board according to claim 15, wherein the thermosetting resin includes a dicyclopentadiene type of epoxy resin and a biphenyl type of epoxy resin.

17. The multilayered printed circuit board according to claim 15, wherein the thermosetting resin further includes one or more resins selected from the group consisting of a bismaleimide resin, a cyanate ester resin, and a bismaleimide-triazine resin.

18. The multilayered printed circuit board according to claim 15, wherein the thermosetting resin is contained in an amount of 400 parts by weight or less based on 100 parts by weight of the amine compound.

19. The multilayered printed circuit board according to claim 15, wherein an equivalent ratio calculated by the following Mathematical Equation 1 is 1.4 or more:

Equivalent ratio=Total active hydrogen equivalent weight contained in the amine compound/Total curable functional group equivalent weight contained in the thermosetting resin.   [Mathematical Equation 1]

20. The multilayered printed circuit board according to claim 15, wherein the amine compound includes an aromatic amine compound containing 2 to 5 amino groups.

21. The multilayered printed circuit board according to claim 15, wherein the thermoplastic resin includes a (meth) acrylate-based polymer.

22. The multilayered printed circuit board according to claim 15, wherein the content of the inorganic filler is 200 parts by weight to 500 parts by weight, based on 100 parts by weight the total of the amine compound and the thermosetting resin.

23. The multilayered printed circuit board according to claim 15, wherein the inorganic filler includes two or more types of inorganic fillers having different average particle sizes, and at least one of the two or more types of inorganic fillers is an inorganic filler having an average particle size of 0.1 μm to 100 μm, and the other one is an inorganic filler having an average particle size of 1 nm to 90 nm.

* * * * *